United States Patent
Zohar et al.

(10) Patent No.: US 6,754,551 B1
(45) Date of Patent: Jun. 22, 2004

(54) JET PRINT APPARATUS AND METHOD FOR PRINTED CIRCUIT BOARD MANUFACTURING

(75) Inventors: Ron Zohar, Gan Yavne (IL); Dan Sagi, Nes Ziona (IL); Benjamin Sadowski, Givat Brenner (IL)

(73) Assignee: Printar Ltd., Rehovot (IL)

( * ) Notice: Subject to any disclaimer, the term of this patent is extended or adjusted under 35 U.S.C. 154(b) by 936 days.

(21) Appl. No.: 09/606,288

(22) Filed: Jun. 29, 2000

(51) Int. Cl.[7] .......................... G06F 19/00; B41J 2/135
(52) U.S. Cl. ........................ 700/121; 347/40; 228/43
(58) Field of Search .................. 700/117–121; 29/760; 101/41–44, 33, 34, 201; 118/46; 438/942–952; 427/96, 420, 421, 424; 216/12–21, 27, 41, 42; 347/1, 5, 16, 20, 40; 228/33, 43, 47.1, 49.5, 178–180.1

(56) References Cited

U.S. PATENT DOCUMENTS

| | | | | |
|---|---|---|---|---|
| 4,573,261 A | * | 3/1986 | Honda et al. | 29/701 |
| 4,668,533 A | | 5/1987 | Miller | 427/98 |
| 4,748,453 A | | 5/1988 | Lin et al. | 346/1.1 |
| 4,767,489 A | | 8/1988 | Lidner | 156/345 |
| 4,824,010 A | * | 4/1989 | Inoue et al. | 228/180.21 |
| 4,963,882 A | | 10/1990 | Hickman | 346/1.1 |
| 4,999,646 A | | 3/1991 | Trask | 346/11 |
| 5,207,115 A | * | 5/1993 | Takei | 74/479.01 |
| 5,239,312 A | | 8/1993 | Merna et al. | 346/41 |

(List continued on next page.)

FOREIGN PATENT DOCUMENTS

| | | |
|---|---|---|
| DE | 198 42 379 A | 5/2000 |
| JP | 08048040 A * | 2/1996 |
| WO | WO-200201929 A * | 4/2003 |

OTHER PUBLICATIONS

*Printed Circuits Handbook*, Clyde F. Coombs, Jr., Third Edition, 1988, pp. 16.1–16.8.
SMEMA Fiducial Mark Standard 3.1 from http://ipc.org/html/smemeastandards.htm totaling 4 pages. No date.

(List continued on next page.)

*Primary Examiner*—Maria N. Von Buhr
(74) *Attorney, Agent, or Firm*—Fitch, Even, Tabin & Flannery

(57) ABSTRACT

A jet dispensing print system for dispensing a liquid or viscous, jettable substance as a pattern onto the surface of a PCB in an industrial manufacturing PCB production line. The system includes a printing system having a printing bridge system, that includes a static and rigid printing bridge to accommodate in a precise manner several jet print heads, each being fitted with a multitude of jet nozzles. The jet print heads are utilized to achieve multiple redundancy whereby part of the total amount of available nozzles are utilized as back-up nozzles. A printing table positioned underneath the static and rigid printing bridge, accommodating a vacuum table with area-addressable suction force, whilst the pattern is dispensed in a jetting manner onto the PCB. A motorized system, for moving the printing table simultaneously in two perpendicular directions. An ink-supply system for supplying the several jet print heads with the liquid or viscous substance. A control system responsive to the pattern and PCB dimensional distortions for controlling the system in order to achieve at desired registration precision level the dispensing of liquid or viscous, jettable substance as the pattern onto the surface of the PCB, and includes an user interface for providing a status report of the printing system. The jet dispensing PCB print system is utilized for inter alia, legend print, solder mask, etch resist mask, plating resist, temporary (peelable) mask, adhesives, CSP and bare die encapsulation.

75 Claims, 12 Drawing Sheets

U.S. PATENT DOCUMENTS

| | | | | |
|---|---|---|---|---|
| 5,270,368 | A | | 12/1993 | Lent et al. ............... 524/236 |
| 5,356,658 | A | * | 10/1994 | Hertz et al. ............... 427/96 |
| 5,560,534 | A | * | 10/1996 | Okada et al. ............... 228/37 |
| 5,587,730 | A | | 12/1996 | Karz ............... 347/43 |
| 5,590,455 | A | * | 1/1997 | Kato et al. ............... 29/564.1 |
| 5,637,426 | A | | 6/1997 | Uchikawa ............... 430/9 |
| 5,640,183 | A | * | 6/1997 | Hackleman ............... 347/40 |
| 5,790,150 | A | | 8/1998 | Lidke et al. ............... 347/41 |
| 5,793,392 | A | | 8/1998 | Tschida ............... 347/67 |
| 5,984,455 | A | | 11/1999 | Anderson ............... 347/47 |
| 6,000,124 | A | * | 12/1999 | Saito et al. ............... 29/830 |
| 6,076,910 | A | * | 6/2000 | Anderson ............... 347/12 |
| 6,439,681 | B1 | * | 8/2002 | McClellan ............... 347/14 |

OTHER PUBLICATIONS

SMEMA Screen Printing Terms and Definitions Standard 5.0 from http://ipc.org/html/smemastandards.htm totaling 4 pages. No date.

SMEMA Fluid Dispensing Terms and Definitions Standard 7.0 from http://ipc.org/html/smemastandards.htm totaling 6 pages. No date.

Japanese Publication No. JP 9–18115 dated Jan. 1997.

Japanese Publication No. 11–87883 dated Mar. 1999.

"Solder Resist" article by Lyle R. Wallig in Printed Circuits Handbook on pp. 16.1–16.9, 1988.

Printouts from www.sematech.org/public/publications/dict/con to cz.htm totaling 11 pages. No date.

Printouts from www.sdcbs.com/term.htm totaling 14 pages. No date.

Japanese Publication No. 4–253603, published Sep. 9, 1992. (English translation of Abstract only).

Japanese Publication No. 1–187883, published Jul. 27, 1989. (English translation of Abstract only).

* cited by examiner

*PRIOR ART*

US 6,754,551 B1

JET PRINT APPARATUS AND METHOD FOR PRINTED CIRCUIT BOARD MANUFACTURING

FIELD OF THE INVENTION

The present invention relates to printed circuit board manufacturing and in particular to an apparatus and method for depositing various patterns on printed circuit boards using jet-dispensing technology.

REFERENCES

There follows a list of references that is referenced in the following description.
1. Sematech Dictionary (http://www.sematech.org/public/publications/dict/con_to_cz.htm)
2. Circuit Board Terminology (http://www.sdcbs.com/term.htm)
3. Institute for Interconnecting and Packaging Electronic Circuits (IPC), Lincolnwood, Ill.
4. SMEMA 7 Fluid Dispensing Terms and Definitions (http://ipc.org/html/smemastandards.htm)
5. SMEMA 3.1 Fiducial Mark Standard (http://ipc.org/html/smemastandards.htm)
6. Printed circuits handbook, /Clyde F. Coombs, Jr., editor-in-chief—3$^{rd}$ ed. ISBN 0-07-012609-7
7. U.S. Pat. No. 5,637,426 Uchikawa June 1997
8. U.S. Pat. No. 4,668,533 Miller May 1987
9. Laid-Open (Kokai) No. Hei 9-18115, Niijima January 1997, Japan
10. U.S. Pat. No. 4,767,489 Lindner August 1988
11. U.S. Pat. No. 5,270,368 Lent et al, December 1993
12. Laid-Open (Kokai) No. Hei 11-87883, Takada et al., March 1999, Japan
13. U.S. Pat. No. 4,748,453 Lin et al., May 1988
14. U.S. Pat. No. 4,963,882 Hickman, October 1990
15. U.S. Pat. No. 4,999,646, Trask, March 1991
16. U.S. Pat. No. 5,239,312, Mema et al., August 1993
17. U.S. Pat. No. 5,790,150 Lidke et al., August 1998
18. U.S. Pat. No. 5,587,730, Karz, December 1996
19. U.S. Pat. No. 5,984,455, Anderson, November 1999
20. U.S. Pat. No. 6,030,072, Silverbrook, February 2000

GLOSSARY

There follows a glossary of terms used in the following description. The definitions of the terms are given for convenience of explanation and should not be regarded as binding.

| | |
|---|---|
| SMT | Surface Mount Technology |
| SMA | Surface Mount Adhesive |
| HASL | Hot Air Solder Leveling |
| PCB | Printed Circuit Board |
| Conformal Coating | thin, nonconductive film applied to a circuit for environmental or mechanical protection; usually plastic or inorganic [1] |
| UV curing | Polymerizing, hardening, or cross linking a low molecular weight resinous material in a wet coating or ink, using UV (ultraviolet) light as an energy source [2] |
| Etching | The process of removing unwanted metallic substance (bonded to a base) via chemical, or chemical and electrolytic means [2] |
| Resist | Coating material used to mask or to protect selected areas of a printed wiring board (PWB) from the action of an etchant, solder, or plating [2]. Also conform IPC-T-50 b specification [3] |
| Jet Dispensing | A non-contact dispensing process that utilizes a fluid jet to form and shoot droplets of adhesive, solder, flux or other fluids from the jet nozzle to the substrate [4] |
| Drop-on-Demand jet | A method of jet dispensing where individual drops of material are formed at the end of a fluid jet. The drop is formed by the forward momentum of the fluid being ejected out of small orifice. The jet is typically formed by rapidly changing the volume of a filled chamber of material [4] |
| DOD | Dot-on-Dot - Dispensing droplets on the same target area, either partially overlapping or significantly covering the previous dispensed dot |
| DND | Dot-next-to-Dot - Dispensing successively droplets in a given printed area in a side-by-side pixel manner [15] |
| DDA | Dot-on-Dot-Always - Dispensing always two droplets of smaller ink volume than utilized in the DOD approach, onto the same target area [15]. |
| Banding | Optical or/and physical differences in absorption, media surface temperatures, etc. between leading ink droplets and consecutive ink droplets cause stripes perpendicular to the media movement direction. |
| Seaming | The presence of sharp discontinuities in apparent luminance at each band boundary (i.e. the border between the lowest row of a first print swath and the upper row of the next print swath) [16] |
| Fiducial Mark | a printed board artwork feature (or features) that is created in the same process as the printed circuit board conductive pattern and that provides a common measurable point for component mounting with respect to a land pattern or land patterns [5] |
| Legend | A format of lettering or symbols on the printed circuit beard; e.g., part number, component location and patterns [2] |
| C.O.P. | Cost Of Performance |
| CSP | Chip Scale Packaging |
| SMOBC | Solder Mask Over Bare Copper |

BACKGROUND OF THE INVENTION

The present and ongoing trend of miniaturization and sophistication in electronics and the proliferation of electronic devices in almost all aspects of modern technology have led to stringent demands on the manufacturing of electronic equipment. Mass production of complex systems, incorporating steadily increasing component density in a competitive environment, required automated volume manufacturing procedures of electronic equipment.

The platform that fixates, connects and interfaces most electronic components with each other and with other elements in inter alia, computers, communication devices, consumer electronics, automated manufacturing and inspection equipment, is the printed circuit board (PCB) or printed wiring board (PWB). The manner in which these circuit boards are manufactured and the procedure of inserting and connecting multiple components of large variety (inter alia, resistors, capacitors; and integrated circuits), can be applied in mass production environments, achieving substantial automation, which results in costs reduction, high reliability and high component packaging densities. Backplanes and panels (interconnecting boards, in which printed circuits, panels or integrated circuit packages can be plugged or mounted into or onto) are also manufactured in a similar manner.

Whilst in the beginning of PCB usage, PCB's embodied substantially few components and moderately simple connecting path structures, modern highly dense populated boards require sophisticated and high resolution manufacturing techniques with precise registration capabilities.

To understand the technology of the present invention, a brief discussion follows of the prior art of a common manufacturing process of PCB's and in particular, solder masks and legend process.

Briefly, a PCB at the onset of the manufacturing line constitutes a base of insulating material on which a thin copper layer is laminated or plated, known as a bare copper plated board. A chemical etching step removes selectively areas of the copper to produce paths, which are electrically conducting. This selective removal is achieved by covering the copper layer with a patterned mask (etch-resist) that protects the copper layer in the following etching step. Generally, screen-printing techniques are utilized to form the patterned mask in low end PCB's. In high-end, more densely populated PCB's having generally complicated multi-layer conducting paths, Liquid Photo Imageable etch and solder resist mask procedures (discussed in more detail below) are commonly utilized. UV curing and subsequently developing produced resist masks with predefined patterns. The pattern that remains on the board after the etching step is commonly known as the primary image conductor pattern.

Whilst etch resist masks protects the areas of the conducting paths during the above-mentioned etching step, the solder resist mask protects the conducting paths from being coated with solder during the soldering step. The soldering step commonly connects the components leads to predetermined positions in the conducting paths (commonly called lands or pads) by fixating the leads and the conducting paths, utilizing a molten metal alloy, which after solidifying, achieves a permanent electrically conductive bond. In mass production commonly wave-soldering methods are utilized. In wave-soldering the PCB passages through a molten solder wave that coats the pads and leads and thus forms the required solder joints. The solder resist mask leaves only the pads uncovered that need to be covered by the molten solder, otherwise, also the conducting paths would be covered with solder, causing several problems such as inter alia, short cuts by bridging solder.

It should be mentioned here that in modern manufacturing methods, such as e.g. SMT and HASL the above-mentioned solder mask retains its protective function.

The solder resist functions in addition also as a protection from the environment (especially from humidity) during the serviceable life of the board as commonly the entire PCB is covered by the solder resist, except for the above-mentioned pads. It should be mentioned that a multitude of additional functions are expected or preferred to be performed by the solder mask; and are described in more detail in the Printed Circuits Handbook, Chapter 16 [6]. The Printed Circuits Handbook also mentions the classification in accordance with ANSI/IPC-SM-840 specification, dividing solder mask performance into three classes:

Class 1: Consumer—Noncritical industrial and consumer control devices and entertainment electronics Class 2: General industrial—Computers, telecommunication equipment, business machines, instruments; and certain noncritical military applications Class 3: High reliability—Equipment where continued performance is critical; military electronic equipment.

A person versed in the art is thus aware that solder mask properties have significant bearings on the final product properties and performance.

Before component population and subsequently soldering, the PCB legend is printed on the board to support inter alia, identification, repair, verification and field service of unserviceable boards. The PCB legend includes component ID, polarity marks, frames that indicate physical location of components on the board; and sometimes, additional information such as company name, PCB version; and functional instructions such as a jumper function, description of connectors, etc.

Having described briefly the basic steps in manufacturing, there follows now a description of the prior art coating techniques and related problems of resists and in particular, solder resists. It should be mentioned that the difference in usage between etch resist and solder resist is relatively small as both are functionally masks that need to protect selected areas from certain interactions with etchants, solders, chemical reducing agents, or other external influences.

There are permanent and temporary types of solder resists. The temporary solder resists are usually applied to selected areas and consist commonly of a latex rubber material or any of a variety of adhesive tapes. Commonly, temporary solder resists are applied by manual- or automatic-dispensing methods using typically pre-formed "patches" or strips. By keeping solder out of selected holes, the temporary resists allow temperature or process-sensitive components to be added later. Removal of temporary solder mask is based on the properties of the temporary solder mask. Some of the temporary solder masks are peelable, whilst other are soluble in subsequent cleaning steps, in which cleaning agents are utilized, that also remove such temporary solder masks.

Permanent solder masks are not removed after being applied; and thus become part of the PCB composition and cover substantial areas of the entire PCB. Whilst prefabricated dry solder mask films and screen printing techniques are utilized in commonly less demanding low-end products, hi-end are generally manufactured using the Liquid Photo Imageable Solder Mask method (abbreviated commonly to: LPISM) discussed with reference to FIG. 1.

1. After lamination or plating in a previous step of manufacturing line 100, a PCB is transported 101 to the Solder mask station 102.

2. In the cleaning stage 103, surface preparation usually consists of a mechanical brush scrubbing followed by a pumice treatment, solvent degreasing, chemical cleaning and finally, oven drying.

3. Coating the PCB by LPISM material 104 is performed in the coating stage 105. The coating can be applied to the board by inter alia, blank (no pattern) screen printing, roller coating, curtain coating, or electrostatic spraying.

4. Partially curing the coating, to achieve a tack-free (non-sticking) coating is performed in the drying stage 106.

5. UV Exposure through a photo-tool 107, which was prepared before, and described in more detail below, is performed in the exposure stage 108.

6. Development of the exposed and thus partially hardened mask dissolves and removes the unexposed areas or the exposed areas not hardened by the previous exposure in the developing stage 109.

7. If another method of solder masking is utilized, then some or all steps and stages within boundary 110 are replaced or modified.

8. Final curing stage 111 hardens the mask to perform all functions mentioned above and the PCB is transported 112 to the following station on the manufacturing line 100.

The LPISM process is both capital and labor intensive as can be seen from the list of required equipment:

a. Coating unit (with reference to stage 105)
b. Pre-exposure curing unit (with reference to stage 106)
c. Exposure machine (with reference to stage 108)
d. Developing machine (with reference to stage 109)
e. Conveyors and automated handling equipment for transporting the PCB from each piece of equipment to the next one (113)

To above listed equipment should also be added necessary equipment for photo tool 107, obligatory to produce the optical mask used in above-mentioned exposure stage 108. Opaque and transparent areas are formed utilizing photographic processes and materials, schematically shown in photo tooling station 114.

f. Light sensitive film material 115 is exposed in plotter 116 that images the output from a CAD (Computer Aided Design) workstation or other source onto film material 115.
g. Using appropriate GA (Graphic Arts) processing chemicals film material 115 is processed (inter alia, developed, fixated and dried) in processing stage 118.

As readily arises from the foregoing discussion, there are a multitude of machines, materials and procedures required to complete the solder mask manufacturing stage.

As mentioned above, before the various components are affixed to the PCB, as a last stage in the board manufacturing line is the legend printing station.

Reference is now made to FIG. 3, showing schematically a prior art legend printing process. The required photo tool manufacturing process for screen printing is substantially identical to the photo tool manufacturing process described above in reference to photo tooling station 114 in FIG. 1, and therefore photo tooling station 300 is not further described.

At screen-print tooling station 301 a printing tool is produced that uses the known per se technique of (silk) screen-printing. Screen-printing is widely used because it enables the usage of a wide variety of printing inks and therefore inter alia, is also capable of printing onto a wide variety of substrates. For this reason, screen-printing techniques are preferably used for legend printing. A finely structured net, commonly also called web or mesh, is impregnated or coated with a photo-imageable masking substance 302, commonly called photo resist emulsion, in a coating stage 303. It should be mentioned that screen-printing techniques are sometimes also utilized as a coating technique, because, as mentioned before, a wide variety of inks or in this case, coating substances can be utilized. Therefore, in a screen-print coating process, a "blank" type of mask 304 is used, that substantially defines the total area of the surface to be coated. A short drying step 305 ensures that the photo resist emulsion is tack-free (non-sticking). The photo tool mask, prepared in above-mentioned photo tooling station 300 is brought in close contact with the web, being impregnated with the now substantially dry photo resist emulsion and exposed in a commonly used contact UV exposure device 306. The developing stage 307 will effectively remove areas of the photo resist emulsion, not hardened by exposure to UV light. Thus, the web's numerous holes are now closed or clogged by the photo mask not dissolved in the developing process. The hence prepared web is placed and stretched in a frame of suitable dimensions, before being cured (hardened) in curing stage 308 in order to achieve physical resistance against inter alia, abrasion during the following printing process. Alternatively, the web can be stretched on the above-mentioned frame prior to impregnation with photo resist emulsion and consequent exposure. Significant physical resistance is desired and required as will become evident from the brief discussion of the following screen printing step. Curing is commonly achieved by exposure to elevated temperatures during a determined period of time in a oven. Optionally, curing can be achieved by UV exposure as well, but is rarely utilized due to performance limitations of UV-curable legend inks.

In the screen printing step 309, the above described frame, also known as screen stencil, holding the stretched mesh or web under tension, is brought in close contact with the PCB in preferable precise manner of registration. Suitable legend ink 310 is poured into the frame and a flexible wiper, called the "doctor's blade", is moved from one side of the frame to the other. The "doctor's blade" squeezes effectively the ink through the holes or mazes of the web that were not filled up with hardened photo resist emulsion; and thus, ink is transferred to the surface of the PCB through these holes in a determined pattern. A heating process in oven 311 cures the legend ink and makes it durable and resistant against environmental influences.

Finally, the PCB is transported 312 to a following station in the manufacturing line 313.

Registration problems, related to:

a. positioning the frame and thus the patterned ink transfer onto the PCB;
b. accumulated dimensional distortions of photo tools and stencil screens; and
c. accumulated dimensional distortions of the PCB ("potato-chipping") induced by modern manufacturing steps, such as laminating, heat treatments, cleaning, etc.

have significantly restricted desired registration precision to unsatisfying levels, whilst the ongoing trend towards higher density circuit boards, requiring more urgently corresponding higher registration precision levels. Especially for Multi Layer Boards (MLB) and Double Sided Boards (DSB), registration is significantly critical as sequentially, multiple imaging steps, inter alia, screen printing and lithographic processes, need to be executed, whilst maintaining desired registration.

Whilst prototyping, above-mentioned hitherto method of manufacturing is especially cumbersome and time consuming, as many alterations are induced to the circuits, necessitating preparation of new photo tools for each and every-alteration. As all above-mentioned manufacturing steps are required for each alteration, manufacturing even a small amount of PCB's and inducing a few alterations during the prototyping phase, necessitate substantial investments in labor, material and time.

To shorten circuit board production time, a multitude of publications has addressed problems related to photo tooling and/or screen printing usage. U.S. Pat. No. 5,637,426 Uchikawa June 1997 [7] proposes to use an ink jetter to form a mask pattern directly on a transparent mask substrate, thus circumventing the photo tooling steps, but requiring still the above-mentioned cumbersome LPISM process.

There follows now a discussion on known per se ink jet or generally, jetting technologies and some of their specific shortcomings.

The method of jet dispensing of liquid or viscous substances is well known and has been applied in many fields of technology and today, low-cost, high quality text, graphics and photo-image printing equipment is widely in use, particularly in home and office. Many improvements have made this method significantly adaptable for a wide range of applications and liquid or viscous substances. One out of many publications related to the PCB manufacturing is U.S. Pat. No. 4,668,533 Miller May 1987 [8], disclosing image corollary deposition of ink onto a substrate such as a circuit board, by ink jet technology in a two-step process in which the ink is employed either as an activator or as a sensitizer.

In Japanese Laid-Open (Kokai) No. Hei 9-18115 January 1997, Niijima [9] discloses a resist pattern (for etch resist or solder resist) forming method directly on a board using an ink jet printer, thus circumventing the photo tooling as well.

For single prototype or experimental boards U.S. Pat. No. 4,767,489 Lindner August 1988 [10] discloses a small, compact computer-aided printer-etcher that inter alia, applies a resist pattern of meltable wax or thermoplastic material in a jet dispensing manner.

Suitable UV-curable ink compositions for etch-resists are disclosed in U.S. Pat. No. 5,270,368 Lent et al, December 1993 [11].

In Japanese Laid-Open (Kokai) No. Hei 11-87883 March 1999, Takada et al. [12] disclose an ink jet printing method for solder resist and legend patterns in small lot and trial-stage (prototyping) applications, using UV-curable inks.

Another aspect of ink jet printing is the issue of ink area coverage. Many publications have addressed this issue and in particular for forming images on overhead projection transparency film type of media. Lin et al. [13] mentioned that for projection purposes intense color saturation is desirable and achievable by total ink area coverage and overlapping of spots (the ink dots produced on the media by the ink jet printer). Lin et al. teach that this high quality printing is achievable by avoiding "white" spaces between spots. This is accomplished by two passes of the print head per printing line and selecting a spot size diameter that is substantially equal to $\sqrt{2}$ times the pixel center-to-center distance. Thus, diagonally adjacent spots will just touch while horizontally and vertically adjacent spots will overlap, resulting in 100% pixel area coverage.

In U.S. Pat. No. 4,963,882 Hickman [14] discloses methods to alleviate known per se problems of print quality degradation with extended use of ink jet print heads. Different strategies are disclosed to improve print quality and methods are described that are resistant to degradation of print quality with extended use of print heads. Essentially, a double dotting approach (deposition of two dots of a single color in a single pixel row are formed using droplets from different nozzles, so that the degradation in image quality due to a failed nozzle is significantly reduced. The advantages are obtained at a reduced quality level, meaning the print resolution is being reduced.

Trask in U.S. Pat. No. 4,999,646 [15] discloses improvements in print quality and color uniformity as a direct result of improvements in uniformity and consistency of dot formation. Trask recognizes that inter alia, nozzle direction errors, ink drop volume variations, paper motion errors, and carriage motion errors induce problems related to print quality, ink area coverage and other problems related to imaging on paper and other media. To alleviate these problems Trask proposes to use a combination of:

a. super pixeling in the overlying printed areas to generate dot-next-to-dot (DND) printed images, and b. providing complementary and overlying swath (printed strip or line) patterns of ink jet print.

Merna et al. in U.S. Pat. No. 5,239,312 [16] address the undesirable "banding" and "seaming" by introducing a unique row-interleaved printing method and system, minimizing the non-uniformity in solid patterns.

Lidke et al. [17] disclose a method for selectively printing only a portion of the print dots in a multi-pass printing mode. The method relates to providing pixel data to the print head in accordance with a predetermined firing sequence for a plurality of print nozzles that comprise the print head for each of a plurality of print cycles.

Karz [18] discloses a thermal ink jet printer having redundant printing capabilities by virtue of utilizing a secondary print head. In one mode both print heads supplement each other, whilst in another mode, the second print head backs up the first print head in event of malfunction.

The ongoing demand for greater printing speeds has induced further predicaments such as critical nozzle alignment and nozzle malfunctioning due to increased amount of nozzles and increased nozzle column length of print heads. To minimize these problems, Anderson in U.S. Pat. No. 5,94,455 [19] proposes to utilize an ink jet printing apparatus having primary and secondary nozzles. The secondary nozzles define redundant nozzles addressing nozzle malfunctions and enable furthermore increased printing speed in a non-redundant nozzle printing mode. In the redundant (normal) print speed mode, the printing task of a malfunctioning nozzle is taken over by its associated nozzle on the same horizontal line. Furthermore, Anderson also contemplates to provide a nozzle testing station that tests each individual nozzle on functionality.

Recently, the demand for digital printing presses have lead to many publications related to improvements in ink jet technology, to suffice the stringent demands for high volume and simultaneously, high quality ink jet printers. Silverbrook [20] discloses methods of reducing "downtime" of printing lines by virtue of including at least one spare printing module. Silverbrook also mentions that pagewidth static print heads containing thousands of nozzles benefit significantly from fault tolerance by virtue of redundant nozzles. In consonance with Hickman and Anderson, Silverbrook also mentions the increase of printing speed by using a multitude of nozzles. Moreover, Silverbrook teaches that for high quality printing at lower resolution the amount of ink deposited is directly proportional to the number of dots printed.

It should be noted that all publications mentioned above related to PCB manufacturing, either focus on UV-curable ink compositions or disclose substantially only the method of ink jet printing, in foremost, single or small lot prototyping or experimental circuit board manufacturing applications. However, mass production PCB manufacturing procedures have not yet been disclosed, capable of utilizing advantages of jet dispensing resist mask or legend printing technology for fast, reliable and high quality volume manufacturing, because prerequisites have not yet been met by prior art techniques. Such prerequisites are inter alia, high resolution with zero fault tolerance, position repeatability with very low tolerances, and jettable substances suitable for resist masks.

There is accordingly a need in the art to provide for a jet dispensing system and method that substantially reduces or eliminates the limitations in hitherto known solutions and provides solutions in industrial scale PCB's manufacturing lines of dispensing a determined pattern of various substances and which is also applicable to large sized boards and back planes as well.

SUMMARY OF THE INVENTION

It should be noted that applicable ink jetting methods for industrial PCB manufacturing should preferably, although not necessarily, address the issues of:

1. print quality
   (a) resolution:
      (i) at least 300×300 dpi for legend imaging;
      (ii) at least 600×600 dpi for various etch and solder masks;
   (b) ink area coverage, especially but not limited to etch and solder masks:
      (i) substantially reducing the possibility of pinholes and/or uncovered areas;

(ii) sufficient ink deposit to utilize the deposited image for masking purposes;

(iii) optimizing uniformity (absence of "banding" and/or "seaming") of solid areas (foremost masks);

(c) distortions:

(i) reducing ink droplet distortions due to their relative x-velocity component of travel, upon contact with the print surface;

(ii) compensating for dimensional distortions of PCB ("potato-chipping") due to foregoing manufacturing steps of the PCB;

2. throughput:

(a) outfitting the PCB printer with significantly enough nozzles to:

(i) achieve required resolution at an inherent redundancy to avoid multiple print passes;

(ii) accomplish desired print area coverage with desired amount of ink at, preferably a minimal number of print passes (swaths);

(b) aligning print pattern with a PCB "on-the-fly", thus minimizing handling and positioning of PCB prior to printing;

3. specific PCB manufacturing requirements:

(a) compensating for PCB dimensional distortions or "potato-chipping", enabling accurate registration of printed patterns;

(b) maintaining the PCB flatness within predefined tolerances during printing by sufficient vacuum suction force, enabling sustaining optimum working distance between PCB and print head;

(c) enabling printing of large size PCB's (e.g. up to 24×30") in preferably, one substantially continuous printing step;

(d) enabling a variety of imaging onto PCB's such as inter alia:

(i) etch resist masks,
(ii) solder resist masks,
(iii) plating resist masks,
(iv) legend print,
(v) peelable, temporary masks,
(vi) conformal coatings,
(vii) solder paste printing,
(viii) laminates and conductors,
(ix) PCB holes and via-plugging;
(x) direct printing of resistors and/or capacitors components,
(xi) edging non-uniformity compensation control,
(xii) underfill,
(xiii) bare die and chip-on-board encapsulation,
(xiv) CSP encapsulation, and
(xv) adhesive depositing.

The present invention in various embodiments, provides for an industrial ink jet system and for methods, to print the legend (marking and/or nomenclature) and the solder resist (solder mask) on Printed Circuit Boards (PCB's), including backplanes and panels, utilizing jettable ink compositions. Suitable ink compositions are inter alia: melamine, epoxy, and acrylate inks, each curable either by UV exposure, by heat treatment or/and by a combination of several curing mechanisms. It is noted here, that the present invention is not bound to the use of above-mentioned ink compositions and/or any particular curing procedure.

By one embodiment, the system utilizes a horizontally static and rigid printing bridge, containing multiple industrial print heads, constituting a substantial number (preferably several thousands) of ink jet nozzles. By utilizing a horizontally static and rigid printing bridge, reliability problems induced by acceleration and de-acceleration of moving printing bridges is significantly avoided. The system in addition, utilizes an abundant amount of nozzles for providing a multiple redundancy that is able to address the known per se problem of nozzle malfunctions such as clogging and misfiring. The firing delay between even and uneven numbered nozzles is modified from the manufacturer's recommended values for a determined relative velocity between print head and target surface. Thus, for example, for a determined nozzle gap value and a determined relative print head target surface velocity, a firing delay of 50 $\mu$sec is indicated for achieving a known per se desired dot pattern coverage. By decreasing the firing delay a dot pattern is achieved that is characterized by substantially overlapping of adjacent dots, inducing an inherent redundancy and furthermore, provides the desired ink amount for satisfying masking quality. As this would lower the achievable print resolution by the factor of redundancy, it is noted that the system is equipped with a printing resolution capability higher by the same factor of redundancy, achieving effectively the preferred print resolution, whilst maintaining fault tolerance.

The system in a preferred embodiment is capable of accepting and printing onto any size of PCB up to and including backplane and panel sized (e.g. 24×30 inch) boards, utilizing a vacuum table movable in both x- and y-directions at high velocity and high precision. Furthermore, In order to keep the nozzle orifice of the print heads at optimum working distance from the print target, the horizontally static and rigid printing bridge is capable of moving vertically in the z-direction (perpendicular to the target surface) to accommodate for PCB's having various thickness dimensions. Prior to starting a print job, the rigid printing bridge is set to a predetermined position to accommodate various panel/board thickness, as the optimum jetting distance should be retained between 0.8 and 1 mm.

Furthermore, the vacuum table of the present invention, in accordance with a preferred embodiment, is equipped with a multitude of vacuum inlets, each inlet coupled to a suction zone. Thus, area-addressable suction force is achieved for:

1. achieve necessary PCB flatness within predefined desirable tolerances, if, due to mechanical and heat treatments during the consecutive manufacturing steps, a PCB lacks the necessary flatness. Thus, for PCB's not covering the total vacuum table area, sufficient suction force can be applied to solely the area the PCB covers.

2. temporarily switching in correspondence with the area wherein currently ink is being deposited to a predefined reduced suction force system. Thus, the known per se problem of suction by numerous holes existent in PCB's on which solder masks or/and legend print is being deposited is substantially alleviated.

The system of the present invention, in accordance with preferred embodiments, is equipped with a vision system comprising of a vision processor unit and a vision registration & distortion compensation unit, addressing the common problems of:

a) achieving PCB alignment with the printed pattern and
b) compensating for PCB dimensional distortions.

By adjusting (rotating) the print image, global registration at a desired precision is achieved without necessitating the PCB to be positioned in a precise defined manner. The software of the present invention, in accordance with the preferred embodiment, is furthermore configured with skewing algorithms to achieve full alignment with inter alia, fiducial marks, according to substantially all IPC (Institute for Interconnecting and Packaging Electronic Circuits) standards. Furthermore, the vision system provides high precision global alignment of both legend and solder resist patterns to the PCB dimensional features, enabling the printing step to commence without placing the PCB in a significantly precise predefined position.

In addition, the vision system provides for autonomous identification of malfunctioning nozzles by utilizing a suitable test print pattern that has been printed by preferably, all nozzles. Thus, respective malfunctioning nozzles are identified and consequently, shot down by the system. The system calculates the remaining redundancy and if a predefined redundancy level is not achieved, an appropriate alert signal is generated.

By providing in one embodiment of the present invention, twice as many nozzles as required for a certain print resolution, clogged nozzles, consequently shut down, will not affect print quality (in this context, substantially no degradation in edge straightness, a common result from lower print resolution). The print quality is not affected by virtue of covering each targeted area by at least two dots, coming from two nozzles, achieving that every nozzle is backed up by at least one other nozzle. In one embodiment of the present invention a modified firing timing is utilized and thus uneven row orifices of the same jet print head function as "backup" for the even row orifices or vice versa. In another embodiment, each jet print head of a row of jet print heads is backed up by another jet print head, positioned opposite in a parallel row of jet print heads. In yet another embodiment, a color ink jet print head is utilized, capable of jetting multiple colors simultaneously. By utilizing the same ink for each color conduit, multiple redundancy as described above is correspondingly achieved.

Jettable compositions such as inter alia, melamine, epoxy, and acrylate inks, each curable either by UV exposure, by heat treatment, or/and by a combination of several curing mechanisms, are preferably utilized in the system of the present invention.

The system according to one embodiment of the present invention constitutes a printer console and an operator console, coupled to the printer console by means of cabling.

Notwithstanding improvement in printing speed, it has not as yet reached a desired level, and accordingly, the printing speed still constitutes bottlenecks in high volume manufacturing lines. Thus, in accordance with another embodiment of the present invention, one central operator console commands a multitude of printer consoles, averting bottlenecks by distributing in a parallel manner the printing step to more than one printer.

In another embodiment, the system of the present invention is a stand-alone system and thus the printer console contains substantially all systems.

Those versed in the art will readily appreciate that the present invention enables significantly simpler and less cumbersome resist masks and legend printing procedures than common prior art procedures, described above and in reference with FIGS. 1 and 3 as will become apparent by the description below.

Accordingly, by one aspect of the present invention there is provided: a jet dispensing print system for dispensing a liquid or viscous, jettable substance as a pattern onto the surface of a platform in an industrial manufacturing production line, comprising:

(A) a printing system, that includes:
   (I) a printing bridge system, comprising a static and rigid printing bridge to accommodate in a precise manner several jet print heads, each being fitted with a multitude of jet nozzles, said jet print heads grouped in various arrangements on said static and rigid printing bridge, said jet print heads are utilized achieving multiple redundancy whereby part of the total amount of available nozzles are utilized as back-up nozzles; and
   (II) a platform system, comprising:
      (a) a printing table positioned substantially underneath said static and rigid printing bridge, for accommodating said platform whilst said pattern is dispensed in a jetting manner onto said platform; and
      (b) a motorized system, for moving said printing table simultaneously in at least two perpendicular directions; and
(B) a supply system for supplying said several jet print heads with said liquid or viscous substance; and
(C) a control system responsive to at least pattern and platform data for controlling said platform system in order to achieve said dispensing of said liquid or viscous, jettable substance as said pattern onto said surface of said platform; and
(D) a user interface for at least providing a status report of said printing system.

Accordingly, by another aspect of the present invention there is provided:

A jet dispensing print method for dispensing a liquid or viscous, jettable substance as a pattern onto the surface of a platform in an industrial manufacturing production line, comprising the steps of utilizing:

(A) a printing system, that includes:
   (I) a printing bridge system, comprising a static and rigid printing bridge to accommodate in a precise manner several jet print heads, each being fitted with a multitude of jet nozzles, said jet print heads grouped in various arrangements on said static and rigid printing bridge, said jet print heads are utilized achieving multiple redundancy whereby part of the total amount of available nozzles are utilized as back-up nozzles; and
   (II) a platform system, comprising:
      (a) a printing table positioned substantially underneath said static and rigid printing bridge, for accommodating said platform whilst said pattern is dispensed in a jetting manner onto said platform;
      (b) an area-addressable suction force vacuum table;
      (c) a motorized system, for moving said printing table simultaneously in at least two perpendicular directions; and
(B) a supply system for supplying said several jet print heads with said liquid or viscous substance; and
(C) a control system responsive to at least pattern and platform data and controlling said platform system for achieving said dispensing of said liquid or viscous, jettable substance as said pattern onto said surface of said platform; and
(D) a user interface for at least providing a status report of said printing system.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION

For convenience of explanation the invention is described below with reference to preferred embodiments, which constitute a legend printing and a solder mask printing system. Those versed in the art will readily appreciate that the invention is by no means bound to these embodiments and various dispensing methods for inter alia:

a. primary image conducting patterns, b. etch resist mask patterns, c. temporary masks, d. edging non-uniformity compensation control masks, e. selective conformal coatings, f. chip-on-board encapsulation, g. liquid encapsulates, h. bar codes, and i. adhesives in surface mount technology (SMT)

are within the scope of the present invention. Furthermore, applying certain minor modifications, the present invention is equally suitable for SMT solder paste printing applications.

It is noted that the below-discussed preferred embodiments are based on utilizing DPC (now Hitachi Kokai Imaging Inc.) Gen3 industrial print heads. Other heads can be utilized equivalently, such as the Spectra Inc. Nova 256/80 JA Print heads, albeit some operating correlated parameters need to be amended to accommodate such other printing heads in below described embodiments.

Figure 5A:
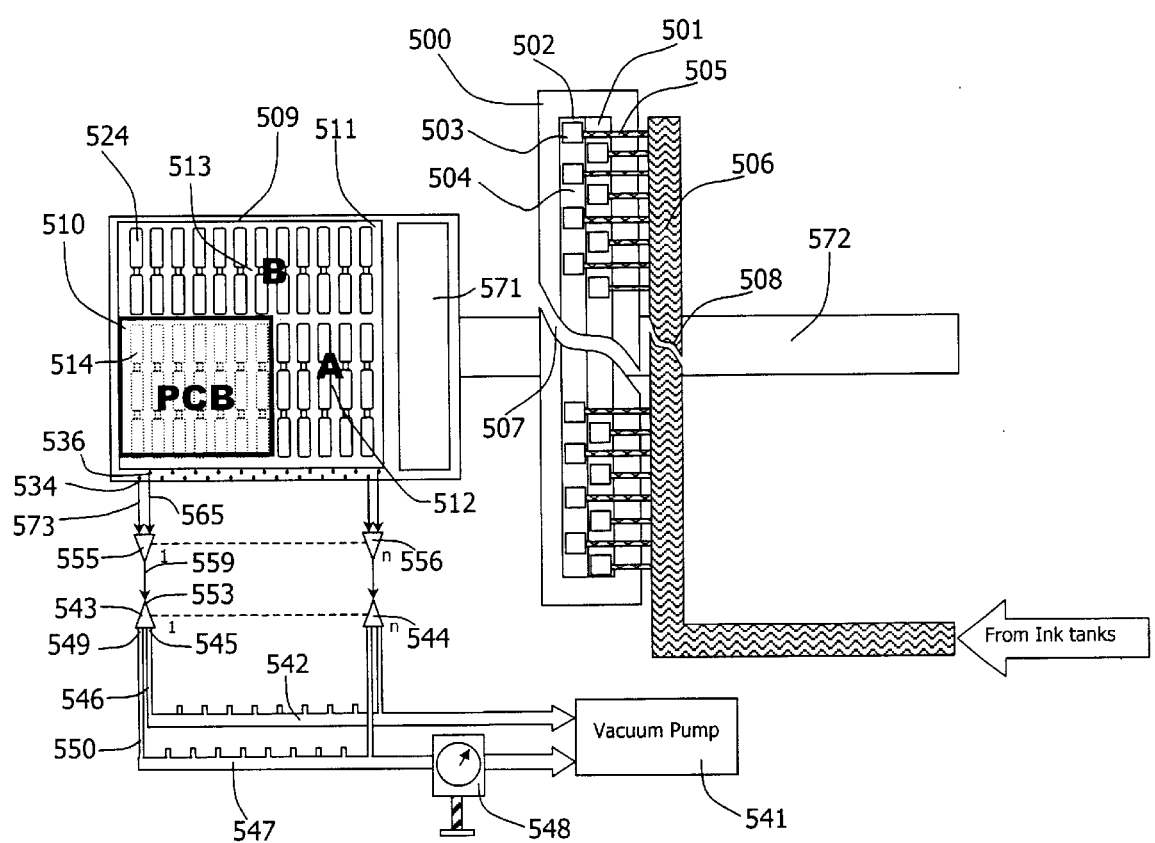
FIG. 5A is a schematic top down view of the jet dispensing print system in accordance with one embodiment of the present invention.

With reference to FIG. 5A a top down view of the jet dispensing print system of the present invention is shown. The printing bridge 500 is a horizontally static, rigid platform, holding jet printing head assemblies 501 and 502, each constituting several and preferably, a multitude of jet printing heads. One out of many possible arrangements of positioning a multitude of jet printing heads in assemblies 501 and 502 is schematically shown as a row, interleaved with the row on the other assembly. Two of the heads, are depicted in the schematic drawing by items 503 and 504. Each head is coupled to tube 505, part of ink supply system 506 for supplying ink from ink tanks (here not shown). Because of specific requirements, further described in more detail, the static and rigid platform (printing bridge) 500 permits the positioning and alignment of each jet printing head to a significantly high degree of precision. To indicate that the abundance and respective disposition of jet printing heads is only schematically indicated, a "break" symbol 507 and 508 is adopted for the printing bridge, head assemblies and ink supply system.

Each individual print head constitutes a multitude of jet nozzles, part of the print head orifice plate and is by manufacturer's design capable of achieving a certain predetermined level of print resolution, for example, 300 or 600 dpi (dots per inch). In order to impede known per se inherent problems of nozzle malfunctioning, the present invention utilizes an abundant amount of nozzles for providing a multiple redundancy further below described in more detail. It is noted here that the multiple redundancy produces a dot pattern that is characterized by covering each target area by two or more ink dots from two or more individual nozzles. In a preferred embodiment, the dots overlap to a significant extent, but not necessarily completely. If one nozzle malfunctions, the area will still be covered by one or more ink dots from one ore more other nozzles. To overcome the decrease in resolution that is inherent if part of the available nozzles are appropriated for backup purposes, more nozzles than required for a certain resolution need to be utilized. In general, an abundance of nozzles is utilized for multiple redundancy.

In one embodiment of the present invention, an industrial color ink jet print head is utilized in a modified manner. Color ink heads are capable of jetting multiple colors simultaneously and commonly 4 colors (yellow, magenta, cyan and black) are utilized to form a colored image. It is noted that in office/home jet printing equipment commonly a separate black ink head is utilized. To achieve the abundant amount of nozzles in one embodiment, the 4-color ink jet print heads are supplied with the same ink for all color conduits (flow areas), achieving thus up to a 3-times or 200% redundancy if utilizing 1 nozzle for the principal image and the other 3 nozzles as back-up. However, in a preferred embodiment 2 nozzles are utilized for the principal image and 2 nozzles perform as backup, thus 100% redundancy or fault tolerance is achieved. This mode of operation is further below in more detail described in reference with FIGS. 8A, 8B, 9C, 9D, 9E, 9F and 9G.

In another embodiment of the present invention a multitude of single color, monochrome ink type jet print head assemblies is utilized, affiliating more than 1500 nozzles providing a desired multiple redundancy.

In order to address the above-mentioned known problems of nozzle malfunctioning, the system of the present invention is designed to operate at a minimum of 100% redundancy, representing twice the number of nozzles required for achieving a certain print resolution.

For reasons of clarity, the electronic multiple print head driver unit, the motorized printing bridge vertical motion system and the electronic motorized planar motion control system are omitted from FIG. 5A and will be discussed in more detail below with reference to FIG. 7.

A printing table 509 is shown in an initial start or parking position to facilitate the loading or placement of a PCB 510 prior to printing. PCB 510 is secured to printing table 509 in a fixed manner by utilizing vacuum table 511 in accordance with a preferred embodiment (described in more detail with reference to FIG. 5B below) which ensures fixation in an immovable manner of the PCB to printing table 509 during the consecutive printing step. Printing table 509 and vacuum table 511 are dimensioned to facilitate acceptance of all commonly utilized sizes of PCB's, including back planes and panels, up to e.g. 24×30 inch. Commonly, PCB's whilst being manufactured, are not ideally flat, but due to multiple layers of various materials, which have been subjected to mechanical and heat treatments during the consecutive manufacturing steps, such PCB's exhibit significant lack of flatness ("potato chipping"). It is known per se that there exist an optimum working distance between the orifice plate of a jet printing head and the surface that is printed on. Significant decrease of print quality is experienced when the working distance deviates from the optimum working distance. To alleviate this common problem, the vacuum table in accordance with a preferred embodiment of the present invention is designed to overcome the maximum commonly encountered height distortions of PCB's and achieves substantial flatness whilst the PCB is affixed to the vacuum table. It should be noted here that considerable suction force needs to be applied to the PCB for achieve predefined desirable planarization. The providing of maximum suction force solely to the PCB affixed to the vacuum table induces following known per se predicament.

Jetting a fluid liquid onto a surface having numerous holes induces suction of jetted, still fluid ink immediately after dispensing, through these holes by the suction force of the vacuum table. It should be noted that solder masks and legend are applied to PCB's, which have at this stage of the manufacturing process when these patterns are applied to the PCB, generally numerous holes. To address this known per se problem, the present invention includes an area addressable suction force vacuum table. Thus, suction applied to the PCB would obviously cause suction of deposited and still substantially liquid or viscous ink through these numerous holes. To alleviate this problem, suction force is temporarily reduced or inhibited in those specific areas where currently ink is being deposited. In a preferred embodiment certain vacuum inlets of the vacuum table of the present invention are temporarily switched by the system in correspondence with the area wherein currently ink is being deposited to a predefined reduced suction force system, described in more detail below with reference to FIGS. 5A and 5C.

As will be described further below in more detail, the printing system of the present invention furthermore is capable of setting the optimum working distance.

There follows now a detailed description of the vacuum table utilized in accordance with a preferred embodiment the present invention for fixating and planarization of the PCB during the jet-printing step.

Figure 5B:
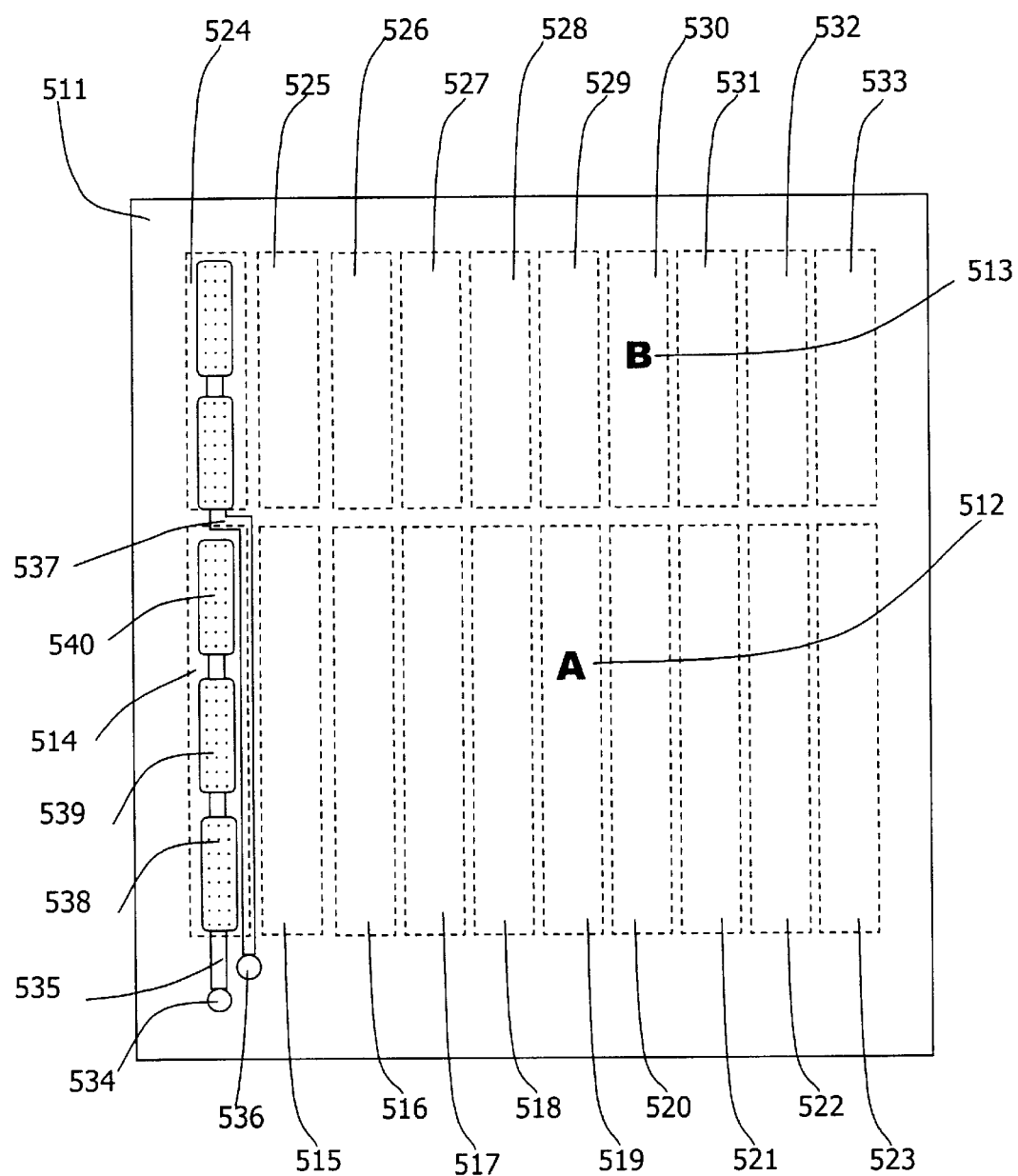
FIG. 5B is a schematic representation of the area-addressable suction force vacuum table in accordance with one embodiment of the present invention.

Referring to FIG. 5B, vacuum table 511 in accordance with a preferred embodiment of the present invention constitutes two addressable suction force areas, area A 512 and area B 513. Each area is divided into a multitude of suction zones 514, 515, 516, 517, 518, 519, 520, 521, 522 and 523 within area A 512 and a multitude of suction zones 524, 525, 526, 527, 528, 529, 530, 531, 532 and 533 within area B 513. Each suction zone within an area is positioned parallel to each other and parallel to the print head assembly, described in more detail below. Suction zone 514 in area A 512 and suction zone 524 in area B 513 are positioned lengthwise to each other to be aligned substantially with the print swath. It should be noted that the present invention is by no means limited to the particular description of vacuum table 511 and inter alia, variations in layout, number of suction zones, and number of addressable areas are within the scope of the present invention. Furthermore, for ease of explanation only suction zone 514 is described in more detail below and the person versed in the art will readily appreciate that all suction zones are substantially identical in their performance.

Suction zone 514 is coupled to first vacuum inlet 534 via conduit 535, whilst suction zone 524 is coupled to second vacuum inlet 536 via conduit 537. A multitude of suction holes are deployed inside suction sector 538, 539, and 540 within suction zone 514, providing suction force to a PCB positioned on vacuum table 511.

Returning to FIG. 5A, there follows now a detailed description of the vacuum subsystems that applies area-addressable suction force from vacuum pump 541 to suction zone 514 and 524. For ease of explanation, only the vacuum subsystems coupled to suction zone 514 and 524 are explained in more detail below and similar to mentioned above, the multitude of vacuum subsystems coupled to each suction zone are substantially identical in their performance.

Suction force is supplied by vacuum pump 541. Vacuum pump 541 is coupled to manifold 542, coupling a multitude of suction-valve-switching solenoids 543–544 (described below in more detail with reference to FIG. 5C) directly to vacuum pump 541. Thus, a predetermined maximum suction force, provided by vacuum pump 541 is available at entrance 545 of suction-valve-switching solenoid 543 via tubing 546, coupled to manifold 542. In addition, vacuum pump 541 is coupled to manifold 547 via reduction valve 548, capable of reducing above-mentioned maximum suction force to a predefined reduced level and optionally, suction force in manifold 547 is reduced to substantially no suction force. Thus, a predefined reduced suction force is available at entrance 549 of suction-valve-switching solenoid 543 via tubing 550, coupled to manifold 547.

Figure 5C:
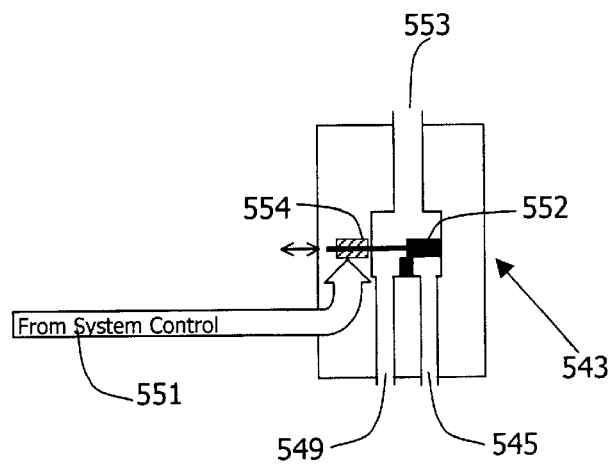
FIG. 5C is a schematic representation of one of the plural suction-valve-switching solenoids utilized in the apparatus in accordance with one embodiment of the present invention.

Referring to FIG. 5C, suction-valve-switching solenoid 543 is schematically shown and is representative for all suction-valve-switching solenoids 1 . . . n 543–544 (FIG. 5A). Maximum suction force tube 546 (FIG. 5A) is coupled to entrance 545 and reduced suction force tube 550 (FIG. 5A) is coupled to entrance 549. Tube 546 and tube 550 are for ease of identification denoted as manifold twin tubing. Whilst the printing heads are jetting a print swatch above suction zones 514 and 524 (FIG. 5A), maximum suction force is applied to all other suction zones not currently underneath the print swath. Thus, system control electrical signals 551, in more detail described below with reference to FIG. 7, will bring about cylinder 552 to inhibit maximum suction force to be linked to sole exit 553 (linked to conduits and consequently, to suction areas underneath the print swath), by virtue of energizing or optionally, de-energizing solenoid 554. At the same time reduced suction force is inhibited to link to sole exit 553, by virtue of cylinder 552 closing entrance 549. FIG. 5C shows schematically a momentarily situation wherein maximum suction force is being inhibited from reaching sole exit 553. Thus it is noted that the present invention has achieved to apply either maximum suction force or reduced suction force (optionally reduced to substantially zero, or no suction force) under control of the print system to addressable suction zones (containing multiple suction areas) of the vacuum table, alleviating substantially the problem of suction of still liquid jetted fluid through holes by the suction force of the vacuum table.

As will be discussed in more detail below, the vacuum table 511 (FIG. 5A) in accordance with a preferred embodiment of the present invention necessitates planarization of PCB's to flatness within predefined desirable tolerances, requiring considerable suction force to achieve this objective. However, in instances where smaller PCB's are affixed to vacuum table 511 no tangible results can be expected from applying suction force to uncovered areas whilst the utilizable suction force for affixing and planarization is reduced from an predetermined level to a less optimum level. The person versed in the art should therefore appreciate that by dividing the vacuum table into preferably, two addressable suction areas, suction force is foremost consumed in areas of the vacuum table 511 where a PCB is existent, increasing thus the available suction force. Thus, for smaller PCB's, system control is capable of limiting suction force only to area A 512, whilst suction in area B 513 is disabled.

There follows now a description of the vacuum subsystem that brings about this achievement, by virtue of the above-mentioned addressable suction force suction zones.

In order to inhibit suction force in area B 513, a multitude of suction-valve-bridging solenoids 1 . . . n 555–556 are utilized.

Figure 5D:
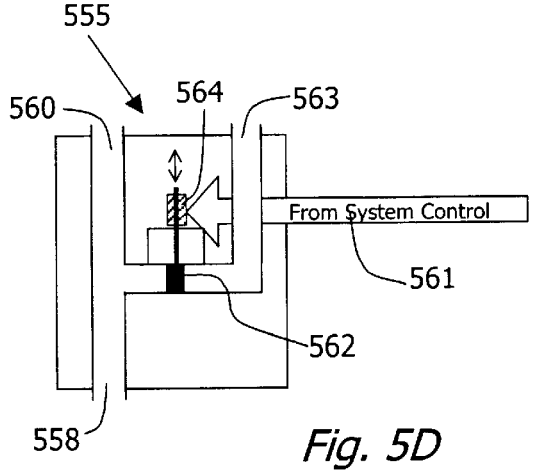
FIG. 5D is a schematic representation of one of the plural suction-valve-bridging solenoids utilized in the apparatus in accordance with one embodiment of the present invention.

Referring now to FIG. 5D, suction-valve-bridging solenoid 555 is schematically shown and is representative for all suction-valve-bridging solenoids 1 . . . n 555–556 (FIG. 5A). Suction force (either maximum or reduced) enters suction-valve-bridging solenoid 555 at sole entrance 558 by means of tubing 559 (FIG. 5A) and exits at exit 560. If area B 513 (FIG. 5A) is to be inhibited from applying suction force (maximum or reduced), then system control electrical signals 561, in more detail described below with reference to FIG. 7, will bring about cylinder 562 to close the link between sole entrance 558 and second exit 563 by virtue of energizing or optionally, de-energizing solenoid 564. In this situation, suction force is thus only directed to exit 560. In the other case, suction force is evenly directed to both exits 560 and 563. As mentioned above with reference to FIG. 5A, there are two vacuum inlets 534 and 536 respectively coupling suction force to suction zone 514 and to suction zone 524. Thus by means of tubing 573 and 565, respectively suction zone 514 and 524 are being coupled to the suction force, whilst suction-valve-bridging solenoid 555 under system control addresses suction force either to suction zone 514 solely or to both suction zones 514 and 524. Tube 573 and tube 565 are for ease of identification denoted as inlet twin tubing.

Figure 5E:
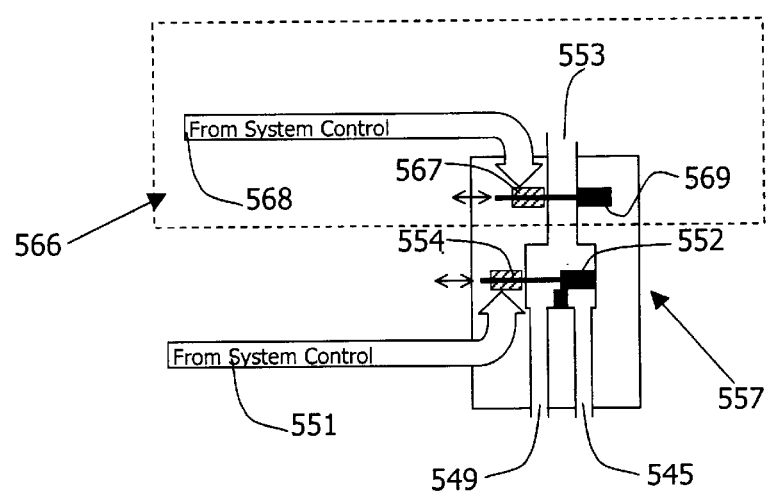
FIG. 5E is a schematic representation of one of the plural suction-valve-switching/inhibiting solenoids utilized in the apparatus in accordance with another embodiment of the present invention.

In FIG. 5E the above described suction-valve-switching solenoid 543 with reference to FIG. 5C is further enhanced 566 by an additional solenoid valve 567, enabling further confinement of suction force to only those suction zones, covered by PCB 510 on vacuum table 511. If a PCB covers only for example, suction zones 514, 515, 516, 517 and 518 (FIG. 5B), then system control electrical signals 568, in more detail described below with reference to FIG. 7, will bring about cylinder 569 to close sole exit 553 by virtue of energizing or optionally, de-energizing solenoid 567 of suction-valve-switching/inhibiting solenoid 557 that inhibits suction force. Thus, if the suction zone to which the particular suction-valve-switching/inhibiting solenoid is coupled to, is not covered by the PCB, substantially no suction force is consumed, therefore further increasing suction force between PCB 510 and vacuum table 511 (FIG. 5A).

It should be noted that there is substantially no limit to the maximum print size achievable, using the system and method of the present invention. It should therefore be appreciated that the herein mentioned limitation of maximum print size of 24×30 inch is only chosen as being the largest size of commonly utilized boards in the PCB industry today. Should there be a need for larger sized board in the future, then it is appreciated that relatively simple and known per se up-scaling techniques can be applied to address future needs.

Returning to FIG. 5A, maintenance print area 571 may constitutes optionally, print head maintenance units, such as:

a. a print head capping mechanism protecting print heads against dried-up ink, clogging orifices which occurs after significant periods of print inactivity or dormancy (the capping mechanism is activated either by user request, or automatically after a predetermined period of inactivity);

b. a purging and priming system for conditioning (cleaning) the print heads orifice plates at predetermined intervals or after each print job;

c. a set of print head wipers for removing (purging) and cleaning excess ink from the print heads orifice plates;

d. a solvent washing system for cleaning the print heads orifice plates with a ink soluble solution;

e. a drainage opening for collecting ink dispensed onto an area above the drainage opening (periodically ink is being dispensed from the orifices to maintaining the nozzles in serviceable condition) and furthermore, for collecting cleaning fluids used during purging and priming;

f. a vacuum suction system for better purging and priming operation.

A reserved area of the printing table 509 is the maintenance test print area 571 wherein the functionality of the printing heads is tested, further below described in more detail.

Printing table 509 is coupled to a high-precision motorized system 572, for moving printing table 509 simultaneously in at least two perpendicular directions.

Those versed in the art will readily appreciate that in order to dispense a pattern onto a surface, relative movements between the print head nozzles and the target surface are relevant.

The preferred embodiments of the present invention utilize a horizontal x-y motorized printing table system and an additional motorized electronic printing bridge motion system for vertical movements, further below described in more detail. For ease of explanation, detailed schematic drawing details of motorized planar system 572 have been omitted from FIG. 5A as such motion systems are known per se in inter alia, plotters and other similar equipment. It is noted that in PCB manufacturing lines however, this motion technique is novel.

Figure 6A:
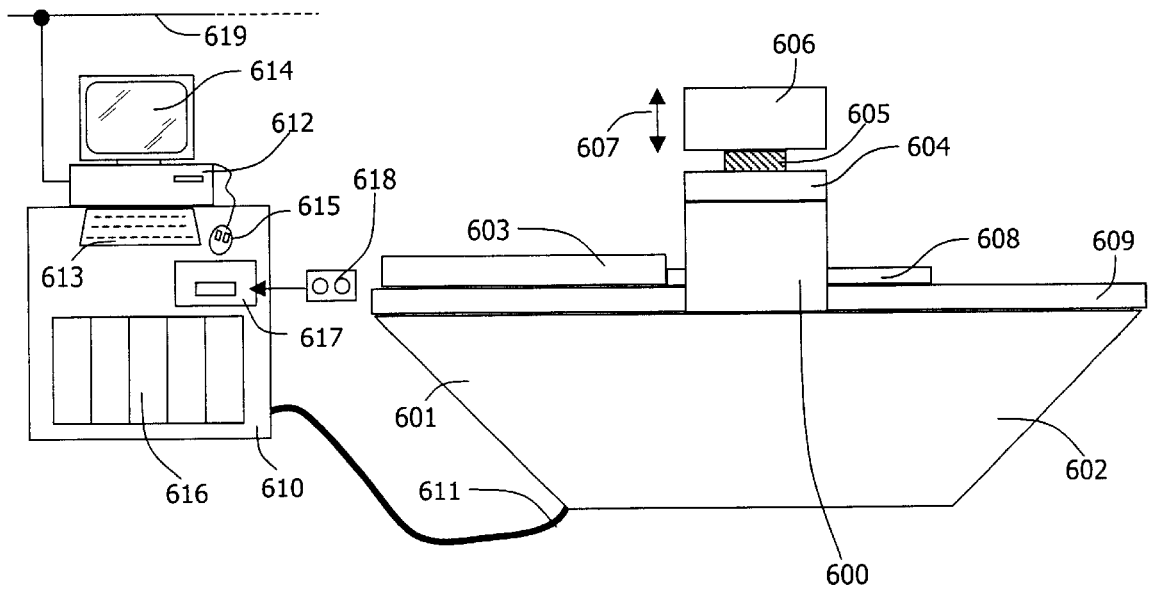
FIG. 6A is a schematic side view representation of the apparatus in accordance with one embodiment of the present invention.

Turning now to FIG. 6A, a schematic side view of the system is shown in accordance with a preferred embodiment of the invention. Central console 600 contains various electric and mechanical systems, further below described in more detail. Additional space is available in two compartments 601 and 602, adjacent to central console 600. In addition to supplying mechanical support to printing table 603, further below described in more detail, compartments 601 and 602 hold inter alia, a vacuum pump system and an ink supply system, including tanks, pumps, tubing, filtering and other optional systems further below described in more detail.

Central console 600 further constitutes a motorized printing bridge vertical motion system 604, constituting two motors (only one motor 605 is visible in the side view of FIG. 6A) for moving the static and rigid printing bridge 606 in a vertical plane 607, substantially perpendicular to the surface of the PCB. In order to achieve optimum dispensing properties, the orifice plates of currently jetting print heads need to be within a significantly narrow range of distance from the target surface, thus necessitating above described printing bridge vertical motion system 604 to enable operating the ink jet print heads at an optimum pre determined working distance. Thus, the motorized printing bridge vertical motion system 604 has been designed to move the printing bridge in a 15 mm. vertical window up and down to adjust the working distance of the jet print heads. For maintenance and comfortable access, such as cleaning, wiping, etc. the motorized printing bridge vertical motion system 604 allows the printing bridge to be raised by at least 400 mm. It should be noted that future design considerations might determine other values for above-mentioned working- and maintenance-distances. For the above-mentioned DPC Gen3heads, the optimal working distance has been determined as approximately 1.0 mm. ±10%.

As mentioned above, relative movements between the jet print heads and the target area are relevant and thus, correspondingly, optimum pre determined working distance between orifice plates and target surface is achieved by either moving the static and rigid printing bridge 606 in a vertical plane, or moving the target surface in a vertical plane. However, in accordance with the preferred embodiments of the present invention, desirable high precision printing table movements have been achieved by limiting motorized system 572 to planar movements exclusively and achieving optimum working distance by moving printing bridge 500 in a perpendicular plane.

Those versed in the art will readily appreciate the following methods and apparatus utilized to maintain these significantly stringent requirements. Thus, in addition to substantial rigid construction of above-mentioned static printing bridge, accurate placement of multiple print heads in the print head assembly, and overall sturdiness of the printing unit's superstructure, the present invention has furthermore directed significant attention to:

1. maintaining the PCB flatness within predefined tolerances during printing by sufficient vacuum suction force, even in situations when printing onto PCB's exhibiting significant dimensional distortions ("potato chipping") mentioned above, utilizing the above-mentioned addressable suction force suction zones subsystems, and 2. providing accurate means (motorized printing bridge vertical motion system) of adjusting the parallelism between vacuum table and printing bridge.

Printing table 603 constitutes vacuum table (511 in FIG. 5A) for fixating in an immovable manner the PCB whilst the pattern is being printed onto the surface of the PCB. Printing table 603 is coupled to arm 608, part of motorized planar system 609 that is responsible for positioning the printing table and thus the PCB, beneath the horizontally static and rigid printing bridge in such a manner, that all sections of the PCB are consecutively target area for those ink jet print heads predestined to cover those sections. Motorized planar systems, comprising linear motors, encoders and closed loop feed back systems are known per se in, for example CNC tools. CNC (Computer Numerical Control) machines are used in manufacturing tasks, such as milling, turning, punching and drilling. Motorized planar system 609 is in the preferred embodiment designed to enable moving the printing table 603 with high precision and simultaneously, at high velocities. To address the consequently resulting undesirable effects of relative velocity between the PCB and the print heads, compensation algorithms are utilized, which are discussed in greater detail further below.

In one embodiment of the present invention, operator console 610 is a separate unit, coupled to console 600 by preferable, cable 611. Other means of communications, wireless or via an existing network are equally conceivable. Console 610 contains a computer 612, with memory with known per se functionality. Computer 612 is coupled to multiple peripheral input devices such as keyboard 613 and other known per se devices such as a mouse 615 for providing operator input. Furthermore, Computer 612 comprises known per se devices such as a diskette drive and storage media such as one or more hard disk drives. Display device 614 provides:

1. visual operator interactivity with various systems, devices and units of said printing system;
2. visual graphical representation of data input from multiple peripheral input devices, below discussed in more detail;
3. inspection of said pattern and enabling amendments to the pattern prior to printing, if so required.

As commonly, personal computers do not have sufficient space inside their casing to accommodate a plurality of additional cards, operator console 610 therefore provides adequate space for all necessary additional cards. Card cage 616 thus holds a passive backplane to accommodate various component cards, described in more detail below. Furthermore, computer 612 constitutes multiple peripheral input devices, such as inter alia, a removable data storage input/output device 617. Commonly, data cartridges 618 are utilized, holding data files in inter alia, "Gerber" format, for inputting the data of the patterns to be dispensed onto the surface of the PCB. Other peripheral input devices such as inter alia, intranet or/and internet 619 are coupled to the system by known per se network interface cards (NIC's), also part of computer 612.

Figure 6B:
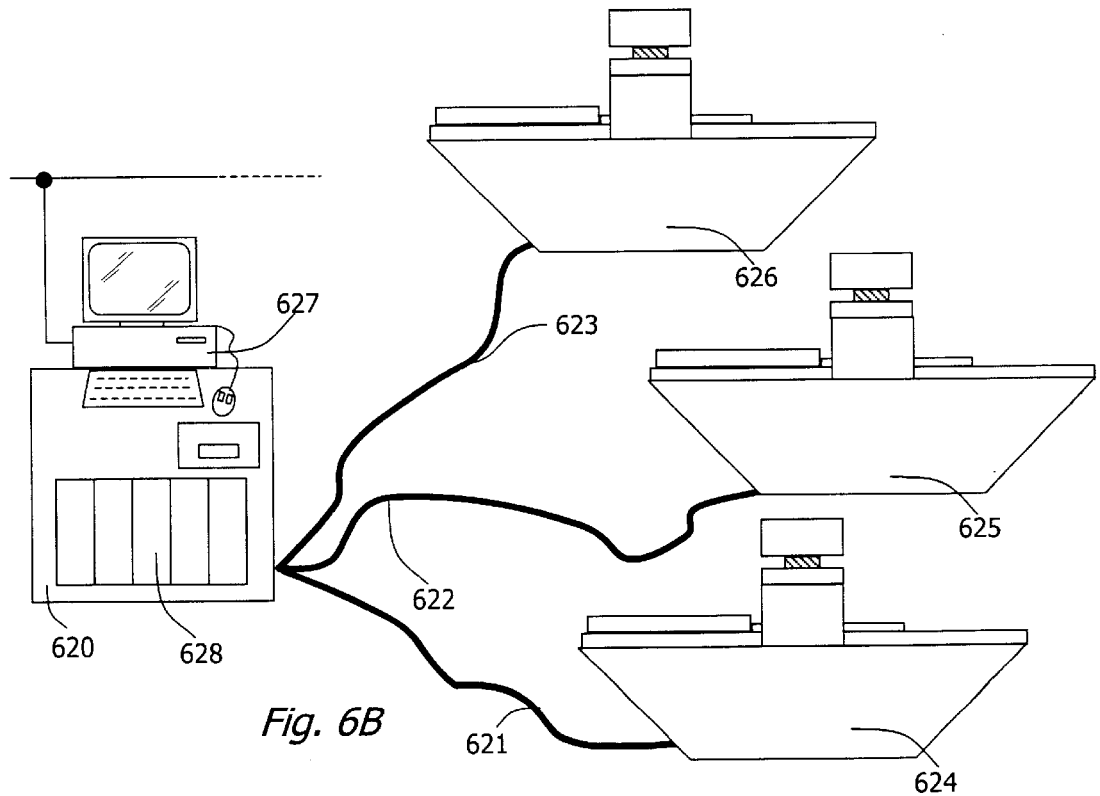
FIG. 6B is a schematic side view representation of the apparatus in accordance with another embodiment of the present invention.

FIG. 6B shows another embodiment of the present invention, wherein one centralized operator console 620 is coupled by multiple cabling 621, 622 and 623 to respectively, print consoles 624, 625 and 626. For ease of explanation, only three print consoles are shown, but the present invention is by no means bound to this specific number of multiple print consoles and any number of print consoles can be employed to avert bottlenecks in high volume PCB manufacturing lines. It should be noted that, notwithstanding significantly increased printing speed, the nevertheless relatively moderate printing speed of the present invention might induce inherent bottlenecks which are effectively averted by employment of multiple print consoles and distributing in a parallel manner the printing step to more than one printer. Utilizing one singular computer system 627 and one singular card cage 628 (616 in FIG. 6A) populated with below-mentioned components, significant savings in equipment and floor space is achieved. In addition, a single operator can thus control the multiple print consoles from centralized operator console 620.

Figure 6C:
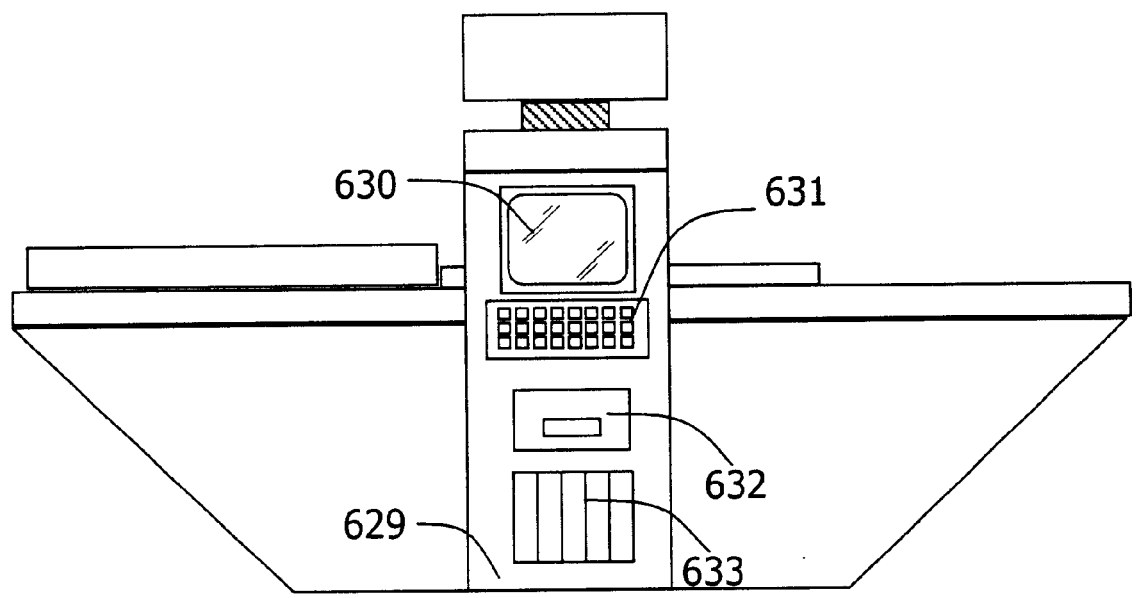
FIG. 6C is a schematic side view representation of the apparatus in accordance with another embodiment of the present invention.

Turning now to FIG. 6C, showing another embodiment of the present invention, wherein console 629 contains all necessary components to operate the system in a more or less autonomous manner, dependent upon various manufacturing line design considerations. Thus, all above described components can be fitted into console 629 of the jet printer to save floor space and consolidate the jet printer system. Thus, above described display 630, keyboard 631, and data cartridge unit 632 are all part of console 629. Integral card cage 633 includes in this embodiment above-mentioned computer (627 in FIG. 6B or 612 in FIG. 6A) as a single board computer.

Figure 6D:
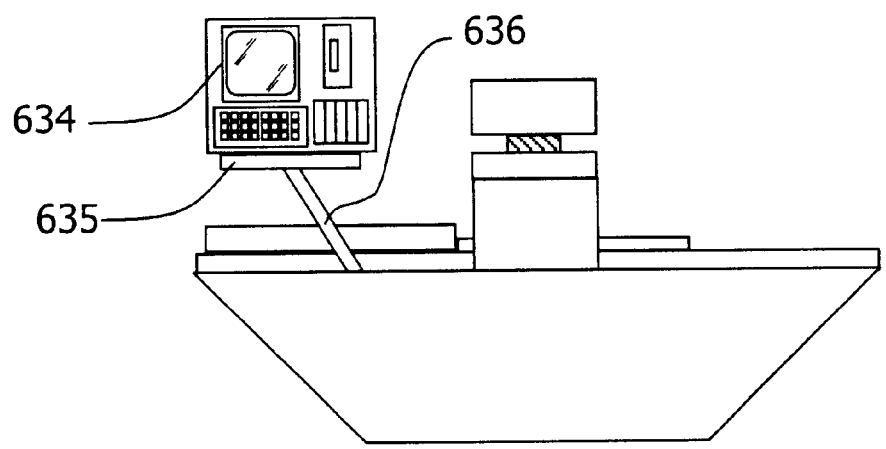
FIG. 6D is a schematic side view representation of the apparatus in accordance with another embodiment of the present invention.

Referring to FIG. 6D, operator console 634 can be optionally fitted into a unit on a turntable 635 attached to a movable arm 636.

Figure 7:
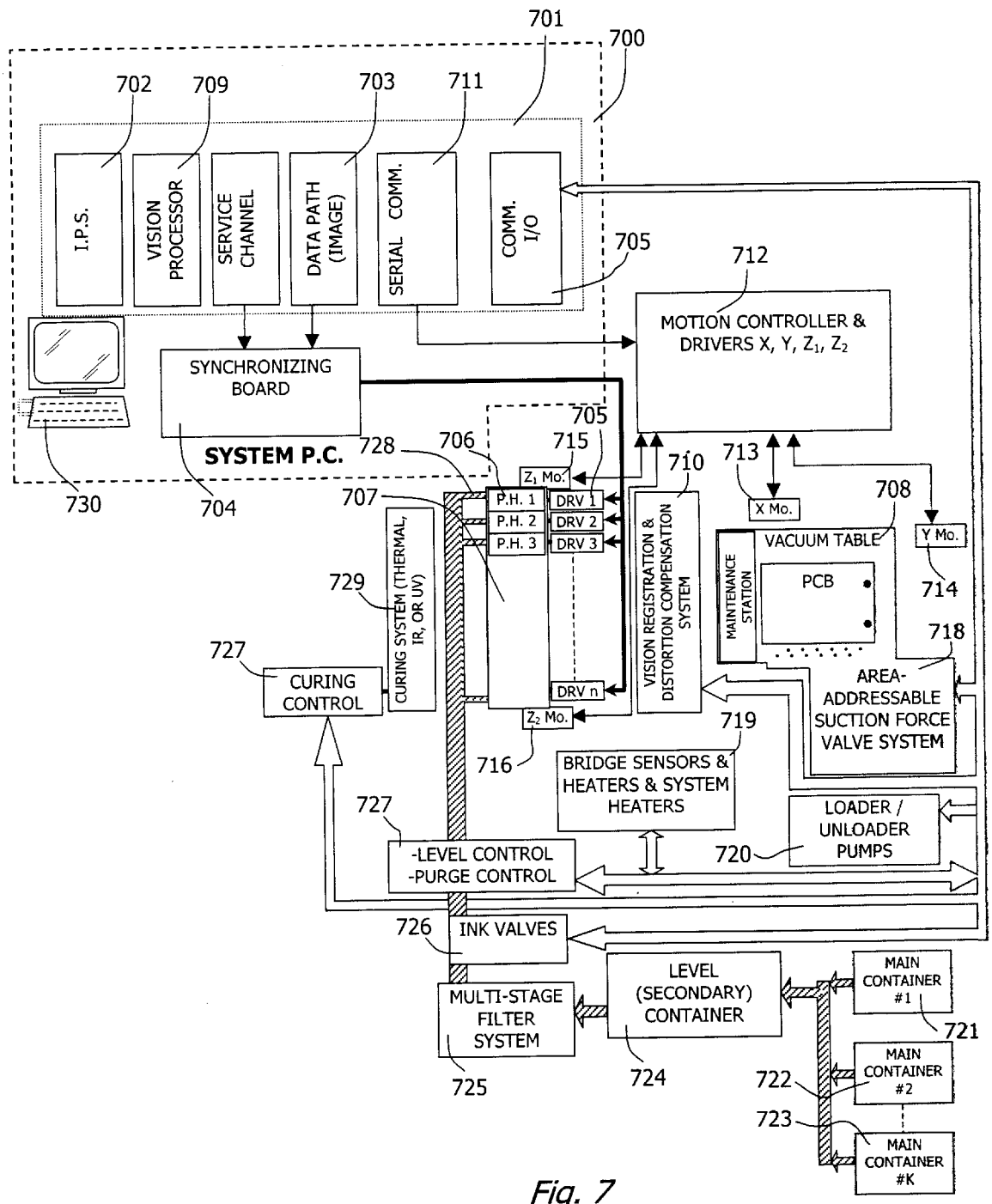
FIG. 7 is a schematic block diagram showing the various components and topographic representation of the data flow of the apparatus in accordance with a preferred embodiment of the present invention.

Turning now to FIG. 7, there follows now a more detailed description of the system block diagram showing the various components and topographic representation of the data flow of the apparatus in accordance with a preferred embodiment of the present invention as described above with reference to FIGS. 5 and 6A.

System P.C. 700 contains aforesaid card cage 701 (616 in FIG. 6A) to accommodate above-mentioned electronic cards and provide supply voltages and data paths to and from these cards. It is noted here that the I.S.P. (Image Processing System) 702 is in the present invention a dedicated software module that functions significantly similar to known per se hardware R.I.P. (Raster Image Processor). I.S.P. 702 converts commonly supported image file formats such as PDL (Page Description Language), postscript or other vector-type of graphic files into a pixel-mapped page image, which is in effect the actual print data that is transferred to the printer to print a pattern, representing the image of the data file. A widely used file format is e.g. the Gerber or extended Gerber format. Converted print data is via data path 703 and synchronizing board 704 transferred to the print head drivers 705 and consecutively, the multiple print heads 706, situated on the static and rigid printing bridge 707 (500 in FIG. 5A). Synchronizing board 704 provides the means of synchronizing the data timing with the vacuum table 708 movement.

Optionally, the system is upgraded with a vision system, comprising of vision processor unit 709 and vision registration & distortion compensation unit 710, which is employed for various tasks, in particular for solder mask printing, further below described in more detail. It should be noted here, that for legend printing the inherent printing accuracy and repeatability of the system of the present invention is generally sufficient and thus, the above-mentioned vision system can be omitted for legend printing without significantly detrimental results.

From serial communication unit 711 data is inputted into motion controller and drivers unit 712, which transforms the electrical positional signals, representative of the positional data, into electric control signals, commonly pulses that operate the linear servo motor 713 and brushless motor 714 of the motorized planar system that moves vacuum table 708. Motion controller and drivers unit 712 outputs in addition vertical positional control signals inputted into two motors 715 and 716 that move the horizontally static and rigid printing bridge 707 in a vertical plane, substantially perpendicular to the surface of the PCB. Applicants have found that a vertical movement window of approximately 15 mm. is sufficient to set an optimal desired operational distance between the orifice plate of a jetting print head and the target surface of a PCB that has distinctive thickness differences. Prior to starting a print job, the operator inputs the thickness of the PCB board into the system, which then adjusts the printing bridge height by means of motors 715 an 716 to the above-mentioned optimum working distance. When the system needs to perform maintenance, vertical positional control signals are generated by the system to raise the printing bridge by approximately 400 mm, facilitating various maintenance tasks.

I/O unit 717 communicates with the various systems of the printing apparatus, such as inter alia, bridge sensors & heaters & system heaters 719 and loader/unloader 720.

I/O unit 717 communicates (551, 561 and 568 in FIGS. 5C, 5D and 5E) furthermore with above-mentioned valves (543, 555, or 557 in FIGS. 5A, 5C, 5D and 5E) for achieving area addressable suction force in vacuum table 708, part of area-addressable suction force valve system 718.

There follows now a brief description of the ink supply system of the present invention.

Ink jet printing technology, as mentioned before, is known per se but it should be mentioned that dispensing various liquid or viscous substances that are intended to perform tasks, such as e.g. etch mask, solder mask, legend print, or/and adhesive and, in addition, preferably adhere to stringent specifications, such as above-mentioned IPC-SM-840 specification, is significantly complex. However, the simplified jetting procedure of resist masking, as discussed below, makes the endeavor substantially worthwhile. Utilizing above described systems and methods, together with further below discussed systems and methods the apparatus of the present invention has addressed substantially all known per se problems and drawbacks. The substance to be dispensed for above-mentioned masks and legend printing has been chosen by the applicants in a preferred embodiment as a one-pack epoxy based, heat curable jettable substance or ink, with suitable additives. Thus, the composition of suitable inks contains inter alia, a curable binder, optionally solvents, pigments, dyes, fillers and other functional materials. The binder is a resin combined with other components, which enable curing of the ink after contact with the substrate. The resin can be cured, or heat cured or cured by a combination of several curing mechanisms. Such resins can be based on, but not limited to: melamine, epoxy, or acrylate chemistry. It should be noted here that the term binder is used here as a component, which has the ability to adhere on a substrate, and optionally, to bind several components to the substrate.

For legend printing, a white or yellow pigment is utilized, whilst for solder mask printing a green dye is utilized.

It should be noted, that substantially all utilized inks or adhesives are supplied to the print heads by a common industrial jet ink supply system, constituting:

1. a storage system, constituting: multiple main containers 721, 722 and 723;
2. a secondary container 724; functioning as a level controlling system by applying gravity and physic's principal of communicating vessels, thus controlling the negative meniscus pressure;
3. a pressure regulation system, utilizing above-mentioned principal of communicating vessels;
4. a supply pump system, controlled by system P.C. 700;
5. a multi-stage filter unit 725, controlling maximum particle size of ink substance (in a preferred embodiment $5\mu$ upper limit has been shown to be sufficient);
6. multiple ink valves 726, controlled by system P.C. 700;
7. a level and purge control system 727 with a multitude of level sensing devices;
8. a wiping, solvent washing, purging and priming unit (not shown and mentioned above with reference to maintenance print area 571 in FIG. 5A); and
9. a fluid collection vessel, collecting ink and cleaning fluids (not shown); and
10. an air bubbles drainage system (not shown); and
11. a temperature control system(not shown), constituting:
    (A) a heating unit; and
    (B) a temperature sensing unit; and
    (C) a temperature control unit.

Each individual print head is coupled to above-mentioned ink supply system utilizing a plurality of suitable tubing 728.

Subsequent initial curing (making the dispensed image substantially tack-free), or optionally, complete curing, is achieved in curing system 729, wherein accordingly to the utilized ink type, either thermal, IR (infra-red) oven or curing by UV (ultra-violet) exposure is applied.

Various operator related interactions with the system are performed utilizing a display and keyboard unit 730.

There follows now a discussion about the above-mentioned inherent print redundancy of the present invention, which significantly averts or minimizes known per se ink jet printing problems.

As has been mentioned before, redundant printing capability has been utilized in prior art disclosures. The present invention however, utilizes redundancy in a novel manner by providing an abundance of nozzles and thus, multiple redundancy is achieved, addressing nozzle malfunction, high resolution printing capability and sufficient print speed simultaneously. Those versed in the art will readily appreciate that high-resolution (600 dpi) and fault tolerance ink dispensing technology in accordance with the present invention improve edge resolution of masks and furthermore enable dispensing solder masking substance in addition between densely positioned pads to function as solder dam, alleviating solder bridging problems common in highly dens populated PCB's.

Figure 8A:
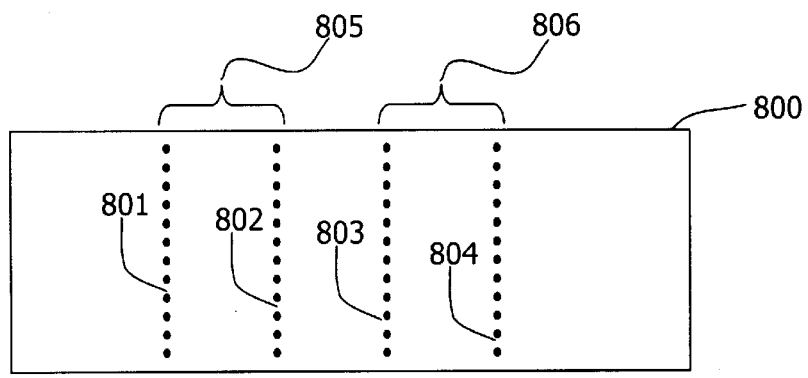
FIG. 8A shows schematically an industrial 4-color print head.

Turning to FIG. 8A, an industrial 4-color print head 800 is shown. Each color is dispensed by a separate row of nozzles. Thus, row 801 dispenses yellow, row 802 dispenses magenta, row 803 dispenses cyan and row 804 dispenses black ink. Utilizing either DOD or/and DND dispensing methods, a predetermined print resolution is achieved by multiple passes and/or varying the relative velocity between media and print head.

In a preferred embodiment all nozzles in rows 801, 802, 803 and 804 are supplied with the same ink and a 100% redundancy is achieved by combining adjacent rows 801 and 802 to one unit 805 for dispensing the principal or first image. Thus, print resolution can be maintained at a predetermined value whilst increasing print speed. Alternatively, the print resolution as specified by the manufacturer can be doubled by maintaining standard (print head manufacturer's recommendations) printing speed.

Adjacent rows 803 and 804 are combined into backup unit 806. Thus each nozzle of unit 805 is backed up by another nozzle of unit 806.

Optionally, rows 801 and 803 are combined into one unit for dispensing the principal or first image and rows 802 and 804 are combined into one backup unit, thus adjacent rows perform as backup.

Figure 8B:
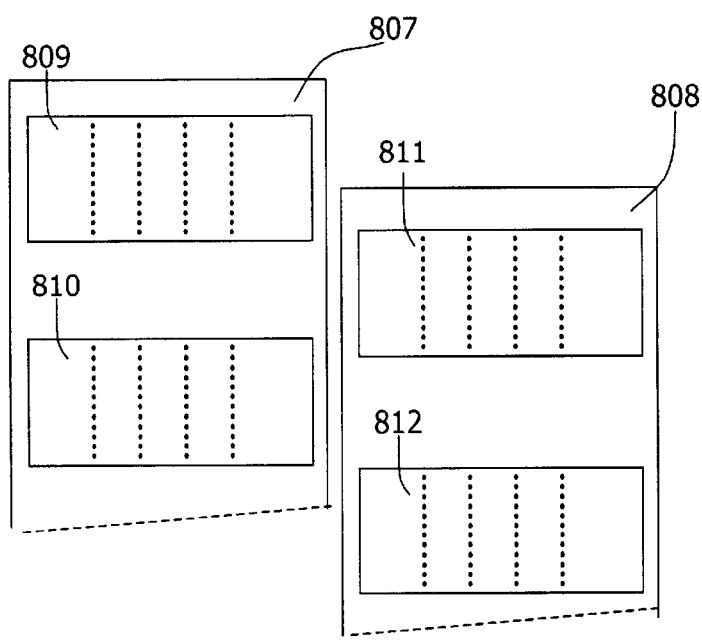
FIG. 8B shows schematically two print head assemblies constituting each a multitude of the 4-color print heads with reference to FIG. 8A.

In FIG. 8B two print head assemblies 807 and 808 are shown, constituting each a multitude of above-mentioned (FIG. 8A) 4-color print heads. In the preferred embodiment each print head assembly contains 10 heads. For reason of clarity, only two print heads are shown. Thus, print head 809 and 810, part of print head assembly 807 are precisely positioned in an interleaved fashion with print heads 811 and 812 of assembly 808. By virtue of utilizing a rigid and static printing bridge, it is noted that a predetermined relative head positioning accuracy is achieved and moreover, maintained during the printing step, as only the PCB is moved in x- and y- directions by the high-precision motorized planar system (572 in FIG. 5A).

Figure 8C:
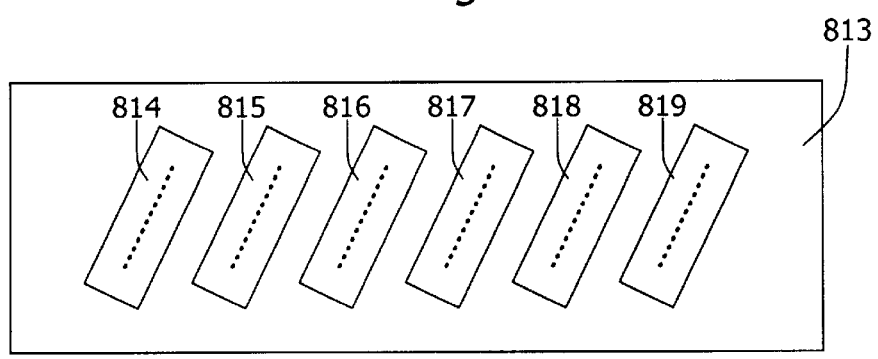
FIG. 8C shows schematically a print head assembly, constituting a multitude of single color, monochrome ink type jet print heads.

FIG. 8C shows schematically print head assembly 813, constituting a multitude of single color, monochrome ink type jet print heads 814, 815, 816, 817, 818 and 819, such as, for example, Spectra Inc. Nova 256/80 JA print heads. It should be noted here that inventors have discovered that a slanted arrangement of heads 814, 815, 816, 817, 818 and 819 as shown here is preferable, but those versed in the art will readily recognize that many more arrangements can prove to be advantageous. Those versed in the art will readily recognize that heads 814, 815, 816 and 817 function substantially similar to the function of the 4-color print head 800 described above in reference with FIG. 8A, whilst enabling adding more rows of nozzles as each row of nozzles represents one separate print head (818 and 819). Similar to above mentioned combining of rows into two units, one for the primary image and one unit as backup (FIG. 8A), single color, monochrome ink type jet print heads 814, 815, 816, 817, 818 and 819 can be arranged in several manners to divide the heads into primary image units and backup units. Therefore, heads 814, 816 and 818 are combined into one unit for dispensing the principal or first image and heads 815, 817 and 819 are combined into one backup unit, thus adjacent heads perform as backup.

It should be noted here that in FIG. 8C only 6 heads are shown, but the invention is by no means limited to this particular number and if so desired, more heads can be utilized, improving resolution, printing speed and/or redundancy level.

Whilst PCB legend print should satisfy demands such as:
1. good readability (sufficient resolution and contrast of the legend ink);
2. position accuracy, solder masking demands furthermore:
3. good masking properties (sufficient ink-thickness to prohibit penetration of molten solder to underlying copper layers);
4. rectilinear edge properties (achievable by sufficient high print resolution);
5. absence of virtually any uncovered area, pin-hole, etc. (achieved by above discussed fault tolerance or print redundancy).

It should be noted that the utilization of multiple print heads in general and especially for industrial PCB print systems has substantially improved performance and thus, C.O.P. by reducing number of print swaths required for a predetermined desirable print quality.

Figure 9A:
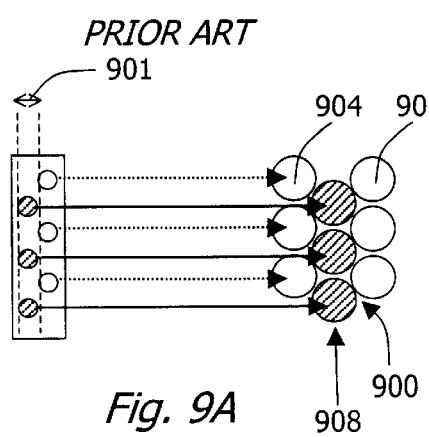
FIG. 9A is a schematic drawing showing a prior art of interleaved jetting.

In FIG. 9A the prior art of interleaved jetting is shown. Either by multiple pass method or utilizing manufacturer's recommended firing timing a dot pattern 900 is achieved. As is well known, even and uneven row nozzles are commonly not fired simultaneously. The following formula is used to calculate the manufacturer's recommended firing delay $\Delta T$:

$$\Delta T = \frac{Gap}{V_{medium}} \quad (1)$$

wherein:
Gap 901 is spacing between even and uneven rows of a given print head, $V_{medium}$ is the relative velocity between print head and target surface.

Thus, for a Gap spacing of for example, 25 $\mu$m and a relative velocity between print head and target surface of 0.5 m/s, firing delay $\Delta T$ equals 50 $\mu$s.

Figure 9B:
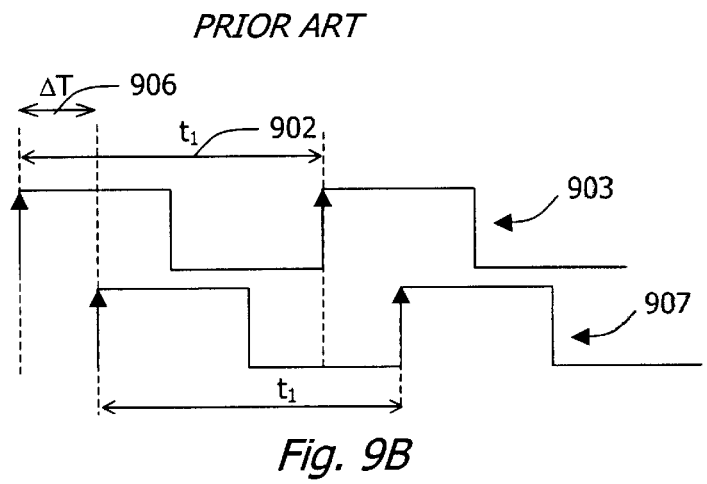
FIG. 9B shows firing timing diagrams for prior art even and uneven rows of a print head.

In FIG. 9B firing timing diagrams are shown for even and uneven rows in accordance with manufacturer's recommendations. Thus the firing frequency $t_1$ 902 for uneven rows 903 results in two dots 904 and 905 arranged as shown in FIG. 9A. Using formula (1), firing delay $\Delta T$ 906 between uneven rows 903 and even rows 907 results in a dot-row 908 arranged as shown in FIG. 9A. It should be noted here that firing frequency $t_1$ 902 (FIG. 9B) for even and uneven rows is substantially equal.

Figure 9C:
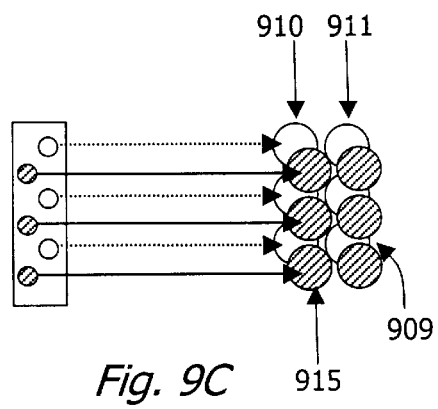
FIG. 9C is a schematic drawing showing the modified firing sequence between even and uneven rows in accordance with a preferred embodiment of the present invention.

In FIG. 9C a preferred embodiment of the present invention is shown, wherein the firing frequency is modified ($t_2 < t_1$) to achieve a dot pattern 909. It should be noted that dot-row 910 and dot-row 911 are now substantially adjacent with a predefined desirable spread, dependent upon $V_{medium}$ and $t_2$.

Figure 9D:
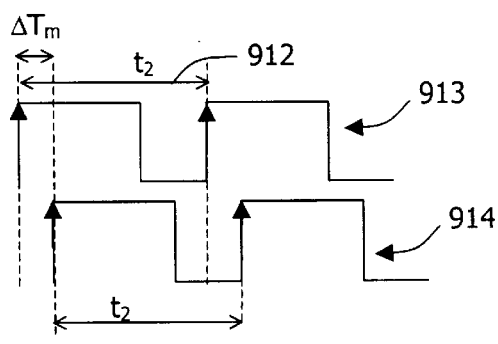
FIG. 9D shows firing timing diagrams of even and uneven rows of a print head in accordance with one embodiment of the present invention.

In FIG. 9D firing timing diagrams are shown for even and uneven rows in accordance with a preferred embodiment of the present invention. Using formula (1), firing delay $\Delta T_m$ 912 ($t_2 < t_1$) between even rows 913 and uneven rows 914 results in a dot-row 915 arranged as shown in FIG. 9C, achieving overlapping between dot-rows 910 and 915 to a predefined desired amount. As mentioned above, firing frequency $t_2$ 912 (FIG. 9D) for even and uneven rows is substantially equal.

Figure 9E:
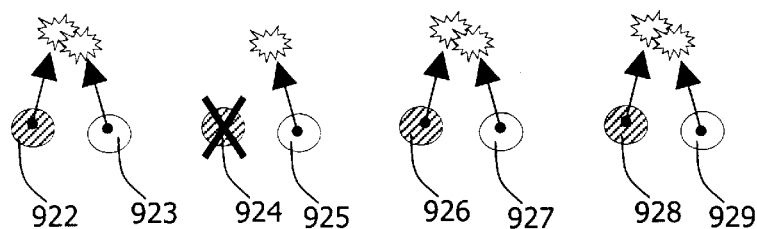
FIG. 9E is a schematic drawing showing the redundancy and backup technique in accordance with one embodiment of the present invention.

Turning now to FIG. 9E, the redundancy and backup technique of the present invention is schematically shown in a 100% redundancy set-up. Each even numbered nozzle of a certain orifice row 922, 924, 926 and 928 is being backed-up by respectively uneven numbered nozzles 923, 925, 927 and 929 of the same row. If the maintenance unit has shut down for instance nozzle 924, "backup" nozzle 925 will thus cover the substrate area not covered by shut down nozzle 924.

Figure 9F:
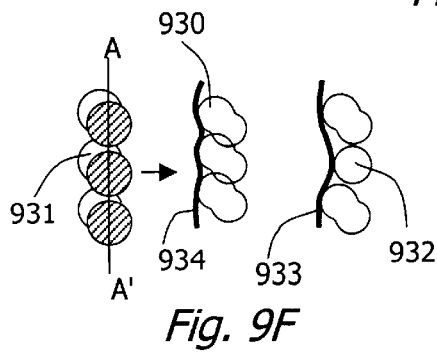
FIG. 9F is a schematic drawing showing the ink dot pattern of two substantially overlapping dots and the resulting edge of the combined printed dot pattern in accordance with one embodiment of the present invention.

FIG. 9F shows the resulting ink dot pattern 930 (909 in FIG. 9C), of two substantially overlapping dots 931, one dot being dispensed by a nozzle, part of the principal image print unit 805 in FIG. 8A, whilst the overlapping dot "backup" dot being dispensed by backup unit 806 in FIG. 8A. Ink dot 930 is in the preferred embodiments a spread out dot, because the dots do not overlap each other completely. The amount of overlapping is by virtue of modifying the firing delay, variable and predefined by preferable system design considerations. It should be mentioned here that the jetted ink substance upon hitting the target surface will spread out a certain distance and combine with adjacent dots to form an uninterrupted layer or mask before solidifying. Even in the event of a malfunctioning nozzle, the single ink dot 932 is still close enough to combine with adjacent dots to form an uninterrupted layer. At the most, single ink dot 932 results in an edge (line 933 approximately represents the resulting edge of the combined printed dot pattern) with insignificant less rectilinear properties in comparison to edge 934 representative of a combined printed dot pattern wherein all nozzles were functional.

Figure 9G:
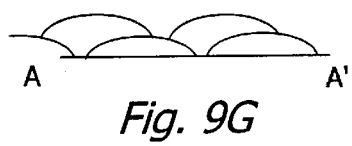
FIG. 9G is a schematic drawing showing a cross section of substantially overlapping dots in accordance with one embodiment of the present invention.

Cross section AA' shown in FIG. 9G illustrates the overlapping and thus dot-on-dot dispensing technique in accordance with the present invention. Thus, a sufficient amount of masking substance is deposited in order to function as a mask, whilst substantially reducing the possibility of pinholes and/or uncovered areas. A timing system part of above-mentioned system P.C. (700 in FIG. 7) is utilized for achieving this technique.

Figure 10A:
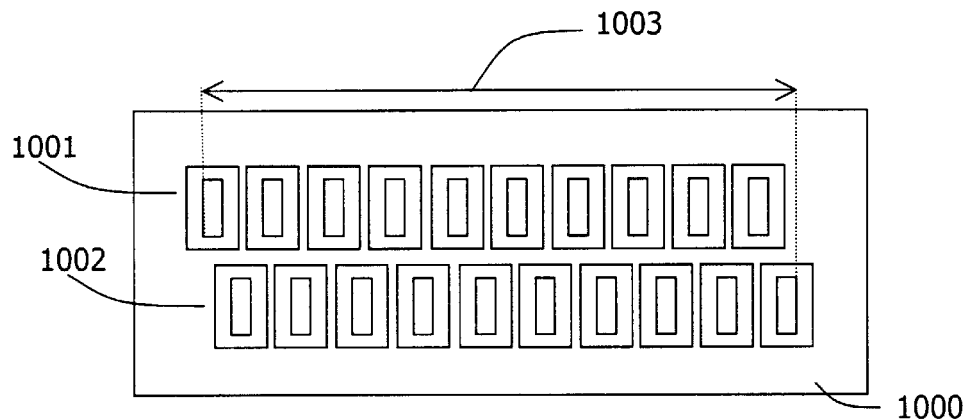
FIG. 10A is a schematic view of the arrangement of ink jet heads on the horizontally static printing bridge.

Turning now to FIG. 10A horizontally static printing bridge 1000 (707 in FIG. 7) is shown in a preferred embodiment constituting an arrangement of 20 heads in two print head assemblies 1001 and 1002 (807 and 808 in FIG. 8) each constituting 10 heads. Thus a print swatch width 1003 is achieved whilst the queue of print heads are operated to achieve dispensing of ink in a continuous ribbon manner.

Figure 10B:
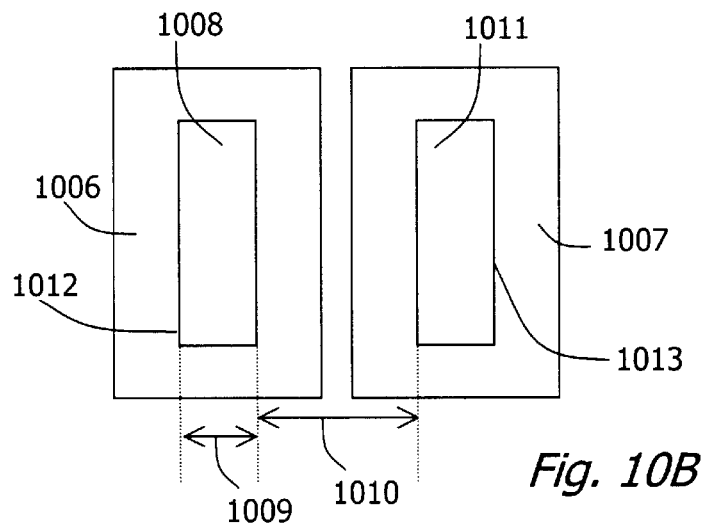
FIG. 10B is a schematic drawing showing the relative positioning of two adjacent ink jet heads in accordance with design dimensional specifications as supplied by the manufacturer of suitable industrial grade ink jet heads.

In FIG. 10B the relative positioning of two adjacent ink jet heads 1006 and 1007 is shown, in accordance with design dimensional specifications as supplied by the manufacturer of suitable industrial grade ink jet heads. Thus ink jet head 1006 has an orifice plate 1008 which is 16 mm. wide 1009. Therefore, adjacent ink jet head 1007 is positioned in relation to ink jet head 1006 in such a manner, that distance 1010 between two adjacent orifice plates 1008 and 1011 is exactly 48 mm. Thus, two orifice plate left edges 1012 and 1013 are 48+16=64 mm. apart from each other, necessitating $^{64}/_{16}$=4 printing passes to cover completely the distance of 64 mm.

Figure 10C:
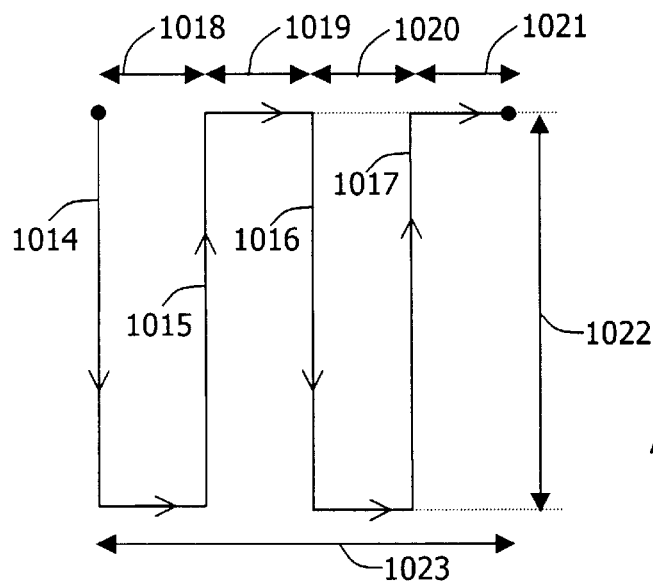
FIG. 10C is a schematic drawing showing the complete printing path to achieve coverage of printing area utilizing jet print heads of the specific manufacturer shown in FIG. 10B.

In FIG. 10C the 4 passes 1014, 1015, 1016 and 1017 necessitate thus a movement 1018, 1019, 1020 and 1021 of the PCB 16 mm. after each pass in perpendicular direction, relative to printing path directions 1022 (in case of bi-directional printing mode). The transit of a PCB from one side to the other constitutes thus 4 passes.

The above briefly mentioned system P.C. (700 in FIG. 7) constituting data path unit 703, synchronizing board 704 and motion controller unit 712 together with software of the present invention are designed to perform the above-discussed dispensing path method.

As in above example for reasons of clarity only two arbitrary moments during two passes are described of one individual jet print head, dispensing ink droplets at the same target area, it should be appreciated by the person versed in the art that if an abundance of jet print heads are available, more than one head can be utilized to cover a particular area with jet printing substance to achieve multiple redundancy. If one or more nozzles should malfunction, there is thus for each such malfunctioning nozzle, at least one but preferably more than one, "backup" nozzle. The maintenance unit performs the capping, wiping, and purging operations prior to beginning a new PCB print job. The test print pattern step, executed subsequent to above-mentioned capping, wiping and purging, induces operation of all nozzles in a distinctive manner and thus a missing pattern indicates malfunction of a specific nozzle. Similarly, a noticeable change in the test print pattern indicates that one or more nozzle exhibit a malfunction such as i.e. misfiring, intermittent firing etc.

In one embodiment, the operator manually inspects the test print pattern and if he concludes that the pattern is in accordance with predefined criteria, the operator starts the print job. If, however a problem has been detected, the operator will either initiate a second capping, wiping, and purging cycle, consequently printing a second test print pattern, or shuts down the identified malfunctioning one or more nozzles, as long as the predefined preferred redundancy is maintained, calculated by the system after manually shutdown of one or more nozzles.

Optionally, the system will effectively shut down a malfunctioning nozzle by identifying malfunctioning nozzles whilst a test print pattern is printed in above-mentioned maintenance print area 571 (FIG. 5A).

Consecutive to shutting down malfunctioning nozzles, either manually or automatically, the system calculates redundancy of the remaining proper functioning nozzles and notifies the system of the prior to print redundancy status. Accordingly to the nature of the to be executed print job, the system either warns the operator or/and operating system that redundancy is diminished or has exceeded tolerable levels. It is noted here, that legend print jobs do not demand a 100% redundancy, but allow the operator or operating system to continue with the print job if so desired. Whereas solder mask, etch resist mask and primary image conductor pattern print jobs demand substantially 100% nozzle operability, therefore necessitating a redundancy of at least 100%. Thus, the system is effectively arrested in order to allow operator or/and operating system to alleviate detected problems before continuing with the print job.

It is appreciated that in order to utilize part of the total number of nozzles for backup purposes, the positioning of each head in relation to other heads is significantly critical, in particular those heads that provide the backup. The utilization of the novel rigid printing bridge is one aspect of the present invention, which significantly enables this requirement. Therefore, it became necessary to move the PCB instead of the commonly practiced technique of moving the print head. As mentioned before, full width page printing heads have been utilized in inter alia, high volume printing presses, however, the present invention utilizes multiple prior art print heads in a hitherto unachievable relative and absolute positional accuracy for usage in PCB high volume manufacturing lines, significantly by virtue of the static and rigid printing bridge.

As discussed above, the number of ink jet heads is dependent upon desired redundancy and desired throughput. It should be noted that dimensional design specifications as determined by the specific manufacturer of the utilized jet printing heads also bears significance in the manner a target area needs to be scanned in order to achieve full coverage.

Referring to above-mentioned publications addressing various problems of banding and other predicaments related to ink jet imaging onto paper substrates, it is noted here, that PCB's substrates do not contribute significantly to bleeding, therefore droplets of dispensed substance will not significantly change their shape after being dispensed onto the substrate. Thus, in the following discussion wherein a PCB is the receiving media, the geometrical shape of the droplets retain significantly their initial shape after hitting the surface of the PCB. It is noted here that drying properties of jetted substances are significantly important for achieving desired final coverage qualities. As will be discussed further below, additional procedures in conjunction with certain ink compositions need to be applied to achieve full coverage of the dispensed substance required to perform as a mask.

In one embodiment the jet printer of the present invention dispenses a solder resist-masking pattern and thus, a bare laminate/copper PCB is the substrate. This major solder resist application technology is commonly called SMOBC. In another embodiment, wherein the jet printer of the present invention dispenses an etch resist masking pattern, the substrate is a planar bare copper layer.

In another embodiment, wherein the jet printer of the present invention dispenses a legend print, the substrate is the above-described solder mask.

It is noted that by utilizing above-described multiple redundancy technique, the effective achievable print resolution is decreased by a factor equal to the redundancy factor. If a double or 100% redundancy is chosen, then the pattern to be dispensed on the substrate has to be printed at double or twice the resolution desired. Therefore, the jet print system of the present invention utilizes an abundance of jet print heads to achieve desired printing resolution with a predetermined redundancy. In accordance with one embodiment of the present invention, the legend print is printed at 300 dpi (dots per inch). In accordance with another preferred embodiment of the present invention, the solder mask resist is printed at 600 dpi or optionally, at 1200 dpi. It should be mentioned that the present invention is by no means bound to these resolution figures and by choosing from a choice of various suitable print heads an appropriate abundance of jet print heads is achievable, therefore, substantially any desired printing resolution can be accomplished.

There follows now a discussion about the vision system, briefly mentioned above (710 in FIG. 7), which is optionally utilized for legend printing, but is a prerequisite for resist masks dispensing procedures, wherein dimensional distortion encountered in PCB's necessitate the positional accuracy and require the below discussed skewing technique of the present invention.

The vision system has 3 main functions, utilized prior to beginning a PCB printjob:
 1. High precision global alignment of both legend and solder resist to the PCB dimensional features, enabling the printing step to commence without placing the PCB in a significantly precise predefined position;

2. Compensating for distorted PCB's, enabling significant high registration accuracy, by means of applying skewing procedures, adapting the print image to be conform the distorted PCB substrate.
3. Optionally, identifying autonomously malfunctioning nozzles, enabling substantial autonomous operation.

The vision system can be utilized to image a suitable test pattern printed in a predefined area of the above-mentioned maintenance area 571 in FIG. 5A, and thus, pattern recognition algorithms can determine the proper functioning of each individual ink jet nozzle. The test print pattern is preferably designed to induce operation of all nozzles and therefore, a missing dot pattern at a particular location in the test print is indicative of a specific malfunctioning nozzle. Similarly, an altered test print pattern is indicative of misfiring or intermittent firing.

Consequently, as has been discussed above in reference with maintenance area 571 in FIG. 5A, either the operator halts the system to perform necessary maintenance or the system is halted automatically and an appropriate alert signal is generated if the optional vision system is utilized.

There follows now a short description of the distortion compensation and global alignment in accordance with a preferred embodiment, utilizing the above-mentioned vision system.

Figure 11A:
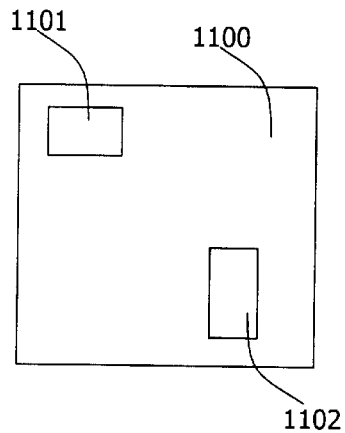
FIG. 11A is a schematic drawing showing the shape and position of two legend elements of a PCB layout.
Figure 11B:
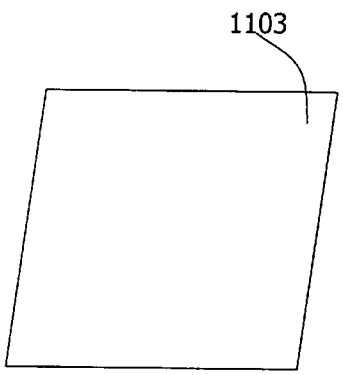
FIG. 11B is a schematic drawing showing a crude dimensional distortion of a PCB after common lamination, heat treatment and cleaning procedures.
Figure 11C:
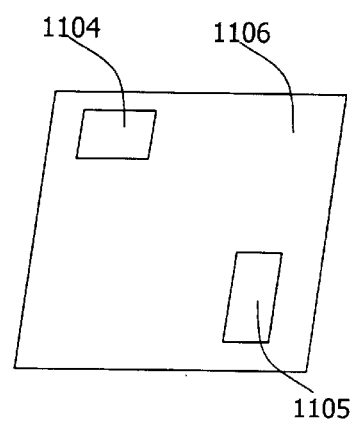
FIG. 11C is a schematic drawing showing the skewing technique of one embodiment of the present invention to achieve precise alignment of the print image, in accordance with the drawing of FIG. 11A, on a distorted circuit board such as shown in FIG. 11B.

In FIG. 11A a common PCB 1100 is schematically shown, further indicating the position of two legend marks 1101 and 1102 to be printed onto the PCB. As has been mentioned above, various manufacturing steps such as etching, laminating, curing procedures, etc. cause commonly a dimensional distortion of the PCB, also known as "potato chipping". In FIG. 11B PCB 1103 is shown having a schematically indicated distortion caused by previous manufacturing steps. It should be obvious to the person versed in the art, that legend marks 1101 and 1102 cannot be printed onto distorted PCB 1103 in the same manner as indicated in FIG. 11A. To compensate for the distortion, the image of the legend marks needs to be skewed (distorted) in a similar manner as the PCB in order to achieve precise positioning notwithstanding the distorted PCB dimensions. For resist masks, preferably fiducial marks or/and pads are utilized to obtain precise positioning reference data. In FIG. 11C both legend marks 1104 and 1105 are thus distorted in accordance with the distortion of PCB 1106. Thus the accurate relative positioning has been maintained to the same accuracy as shown in FIG. 11A.

Figure 12:
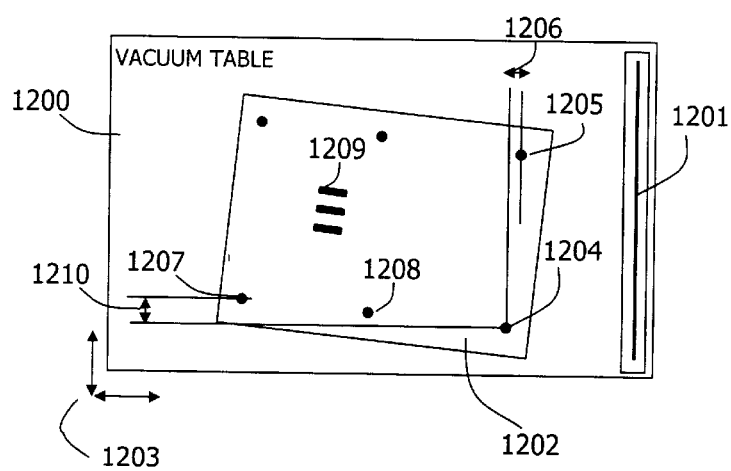
FIG. 12 is a schematic drawing showing PCB alignment on the vacuum table utilizing the vision system and marks present on the PCB such as fudicial marks and pads.

A further function of the vision system is alleviating positional accuracy of a PCB on the vacuum table prior to the printing step. In FIG. 12 vacuum table 1200 and optical sensing device 1201 are schematically shown. Those versed in the art will readily appreciate the position-accuracy required for placing a PCB into the printing position. In accordance with the present invention, stationary optical sensing device 1201 scans PCB 1202 placed onto the vacuum table 1200 moved in x- and y-directions 1203 by the planar motion system and identifies the actual positions of fiducial marks 1204 and 1205. Thus a non-perpendicular placement of PCB 1202 is immediately recognize and measured 1206. Additional fiducial marks such as e.g. 1207, 1208 further assist in establishing the precise angle under which PCB 1202 is placed onto the vacuum table 1200. It is noted here, that fiducial marks are commonly utilized to obtaining precise positional reference data of the various conductive patterns, components and other features part of a PCB. Optionally, pads 1209 can be utilized for this purpose, as their position is known with equally sufficient precision. Thus, for significantly small placement errors (small angles) a more precise measurement can be established by utilizing fiducial marks 1204 and 1207, having a significantly larger base, resulting in a greater displacement 1210. The system PC of the printing apparatus (700 in FIG. 7), equipped with angular transformation algorithms utilizing the thus obtained rotational angle information, rotates the print image data accordingly to compensate for the measured placement error. This method significantly simplifies the automatic handling and required robotic accuracy of the PCB handling and transportation equipment. Moreover, the handling speed is significantly improved by obviating further placement adjustments as the printing step is now started without further alignments.

Having until now discussed the jet dispensing print system, there follows now a brief discussion about the usage of epoxy based inks as the jettable substance for dispensing a pattern onto a PCB, backplane or/and panel.

Epoxy based inks have a significantly better resistance against chemicals and high temperatures to which a dispensed pattern is exposed, than common UV curable inks. Furthermore, epoxy based inks exhibit substantially better adhesion properties to common PCB substrates and do not exhibit significant yellow staining, an effect common with UV curable inks. In addition the compositions of the epoxy based jettable inks, utilized for solder masks achieve compliance with substantially all relevant IPC specifications due to their similarity in composition with commonly used solder mask materials in known per se manufacturing processes, which have been discussed above.

Having described the apparatus and methods of the present invention, those versed in the art will readily appreciate the achievable alleviation in required resist masks and legend printing procedures utilizing the apparatus and methods of the present invention and utilizing jettable ink polymer compositions such as inter alia: melamine, epoxy, or acrylate inks, each curable either by UV exposure, by heat (preferably, IR) treatment, or by a combination of several curing mechanisms. Therefore following applications have been deemed to be suitable for utilizing the apparatus and methods of the present invention with significant improvements as has been discussed above:

1. PCB manufacturing:
   (a) legend print,
   (b) solder mask,
   (c) etch resist for primary imaging (conductors),
   (d) etch resist for etching uniformity (in combination with a vision unit that samples line width),
   (e) plating resist for primary imaging (conductors),
   (f) plating resist for plating uniformity (with, or without vision unit),
   (g) temporary (peelable) mask for selective plating (such as gold plating for edge connectors, while masking all other pads),
   (h) applying laminates and conductors in sequential build-up of PCB's,
   (i) PCB holes and via-plugging.
   (j) direct printing of conductors (utilizing conductive jettable inks), and
   (k) coupled with a dusting unit, direct printing of resistors and/or capacitors components on PCB's (on inner layers—buried) or on outer layers (utilizing carbon based jettable ink having carbon concentration dependant electrical conductive properties by virtue of the carbon particles).
2. PCB Assemblage:
   (a) printing adhesive patterns during PCB assembly,
   (b) coupled with a dusting unit, solder paste printing during PCB assembly, (c) bare die encapsulation (after mounting on a PCB—done hitherto in a tacky manner by inadequate specialized dispensing equipment),
(d) CSP encapsulation,
(e) underfill,
(f) selective conformal coating of a finished PCB assembly; and
(g) administering soldering flux.

It should be noted that above list is by no means limited to the specific applications mentioned.

Those versed in the art will readily recognize that significantly the same apparatus and methods can be applied to a substantially smaller and more simpler printing apparatus utilized for low volume PCB manufacturing and prototyping manufacturing, therefore such modifications are within the scope of the present invention.

Thus, modifications which accomplish a small, desktop sized apparatus, are preferably, but not necessarily limited to:

(a) utilizing widely available common home/small office print heads, significantly less costly and generally smaller in size,
(b) utilizing a simple printing table, optionally without vacuum,
(c) utilizing a significantly smaller dimensioned and less precise motorized planar system,
(d) restricting PCB size to a predetermined desired maximum dimension,
(e) ink containers having lower holding capacity,
(f) utilizing a simpler ink supply system,
(g) providing e.g. maximum of 100% redundancy whilst restricting print resolution to 300 or 600 dpi,
(h) no vision system,
(i) entire control system dimensioned to be contained in a few PC-board sized cards, enabling the complete system to be operated by a common desktop PC,
(j) no skewing and registration system, and
(k) less stringent printing accuracy specifications, less important for above-mentioned purposes.

Above described system offering substantially all above-mentioned features and capabilities, can comfortably realized in a desktop sized enclosure, operated and controlled by a common desktop PC whilst ownership costs can be reduced significantly.

Figure 1:
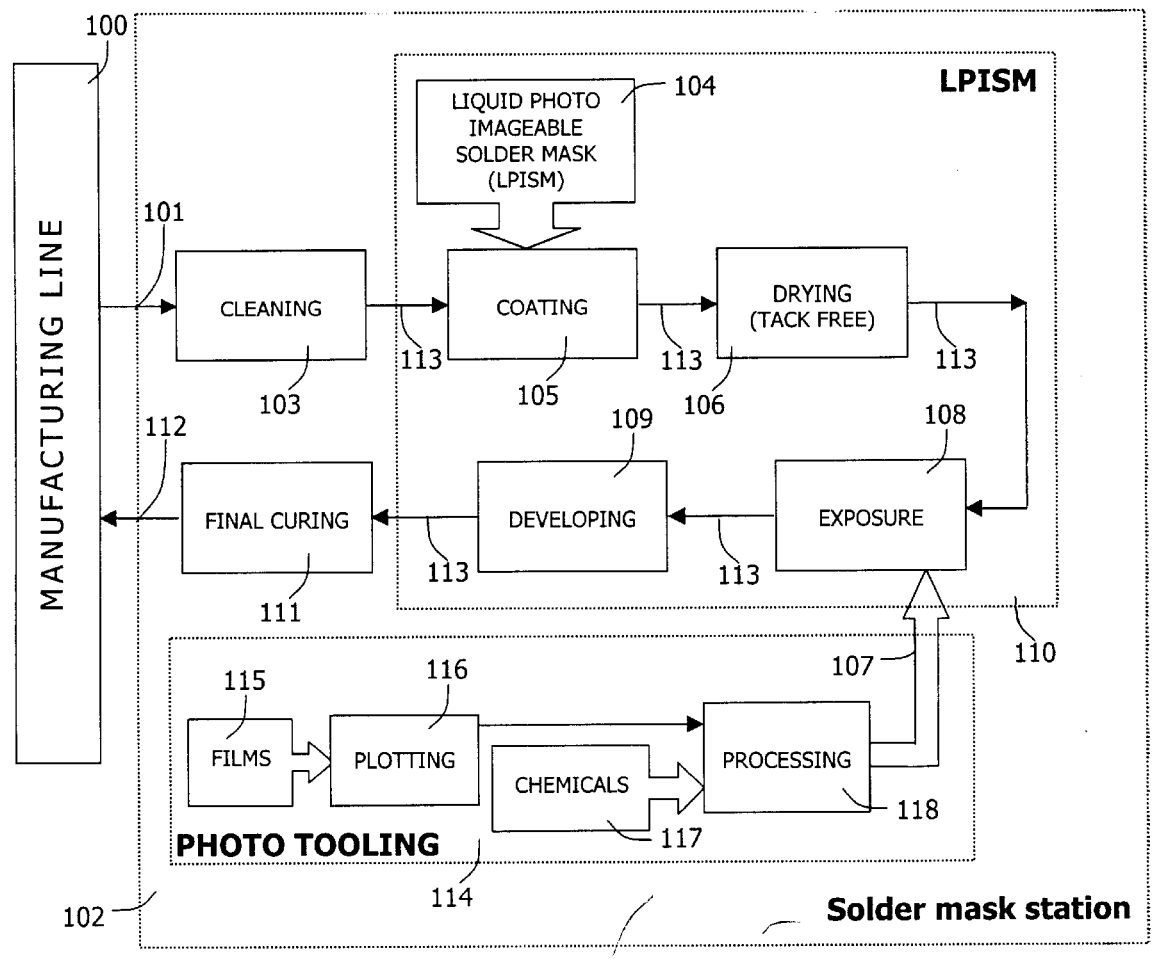
FIG. 1 is a flow chart of the prior art solder mask process.
Figure 2:
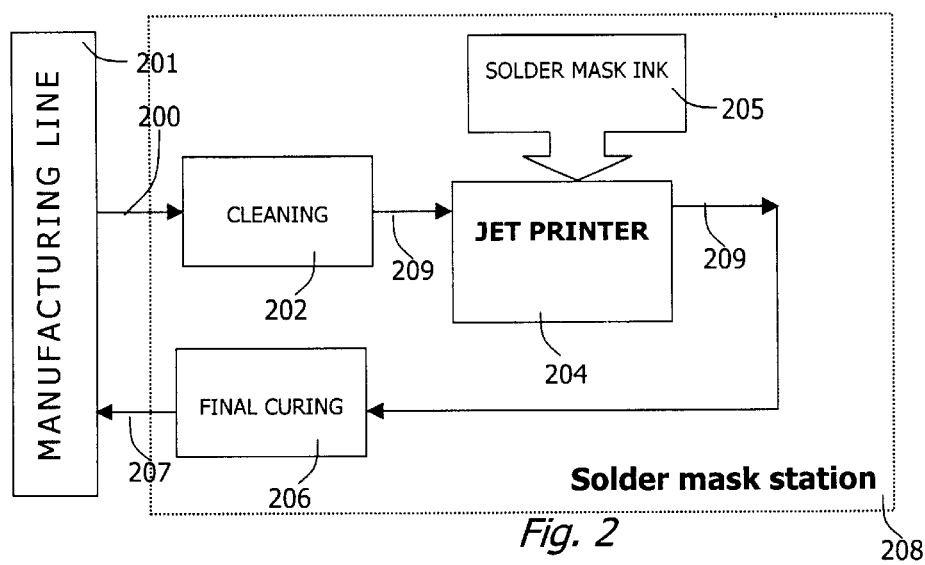
FIG. 2 is a generalized flow chart of a solder mask process in accordance with one embodiment of the present invention.

To further demonstrate the simplified jetting procedure of solder resist masking, FIG. 2 is discussed now and by comparing the following discussion to before-mentioned prior art solder resist masking discussion with reference to FIG. 1, the advantages will become readily apparent.

In FIG. 2, a flow chart of the solder mask method in accordance with one preferred embodiment of the present invention is shown:

1. a PCB is transported 200 from manufacturing line 201 to cleaning stage 203 and it should be mentioned that until this point in time, the procedure is identical to common prior art procedures.
2. The PCB is loaded onto the jet printer 204 and in one step preferably heat curable solder mask ink 205 is dispensed in a desired and precise manner onto the surface of the PCB.
3. A final curing stage 206 (in accordance with known per se procedures) by heat treatment in an oven completes the entire solder mask procedure and the PCB is transported 207 to the following station on the manufacturing line 201.

Because of the few stages in solder mask station 208, in addition to a significantly simpler, cheaper, more precise, and faster solder mask method, further time, equipment and handling is averted by the accordingly few conveyors and automated handling equipment necessary to transport the PCB from each piece of equipment to the next one 209. Moreover, by virtue of the vision system capable of aligning the print image with the actual PCB positioning, discussed above, speed and handling are further improved.

Figure 3:
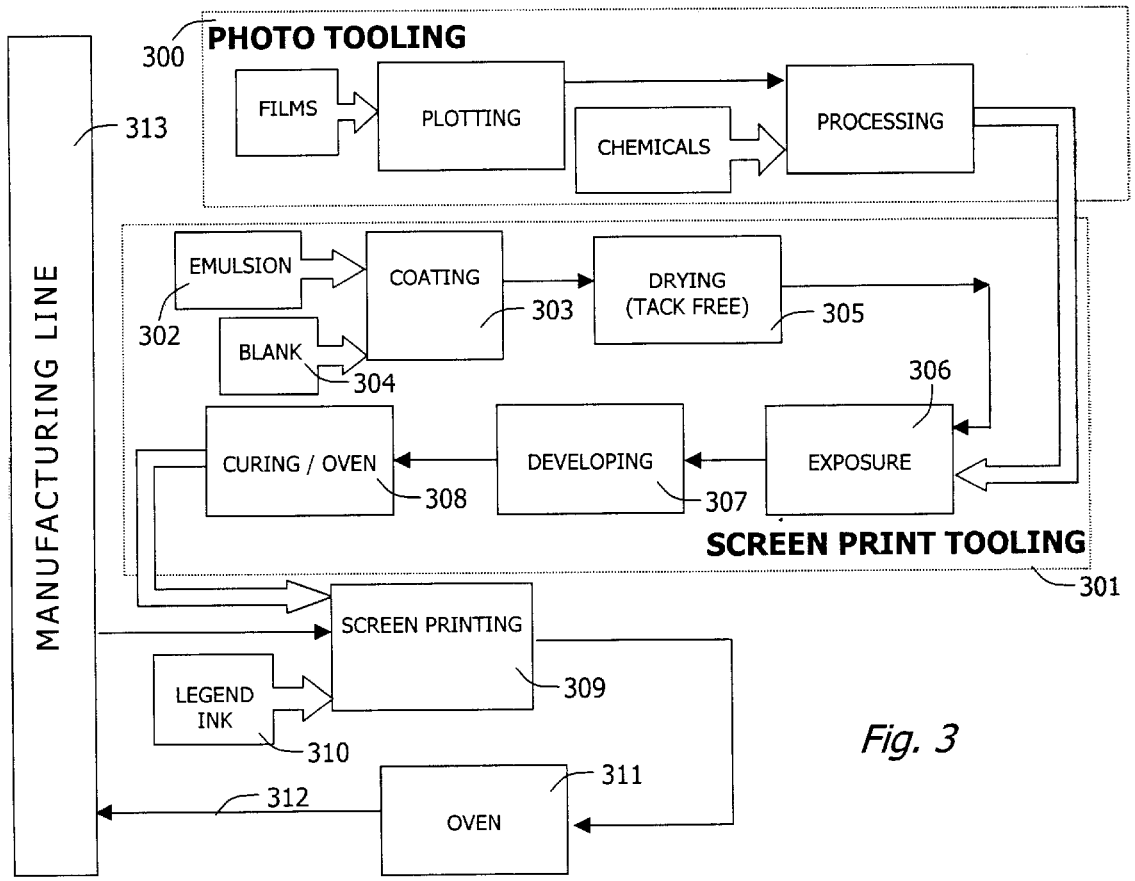
FIG. 3 is a flow chart of the prior art legend printing process.
Figure 4:
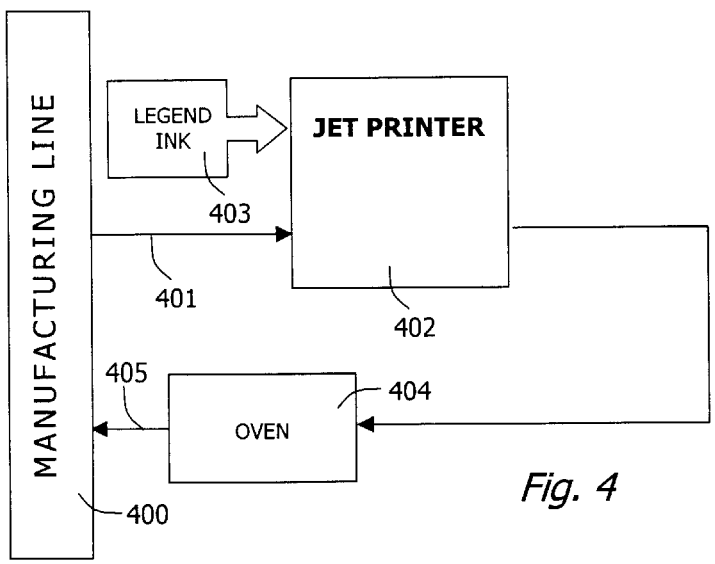
FIG. 4 is a generalized flow chart of a legend printing process in accordance with one embodiment of the present invention.

Turning now to legend printing, FIG. 4 is discussed now and by comparing following discussion to before-mentioned prior art discussion with reference to FIG. 3, the advantages will readily become apparent.

1. A PCB is transported 400 from manufacturing line 401 directly to jet printer 402 and in one step preferably heat curable legend ink 403 is dispensed in a desired and precise manner onto the surface of the PCB.
2. A final curing stage 404 by heat treatment in an oven completes the entire legend printing procedure and the PCB is transported 405 to the following station on the manufacturing line 401.

The present invention has been described with certain degree of particularity. Those versed in the art will readily appreciate that various modifications and alterations may be carried out without departing from the scope of the following claims:

What is claimed is:

1. A jet dispensing print system for dispensing a liquid or viscous, jettable substance as a pattern onto the surface of a platform in an industrial manufacturing production line, comprising:

(A) a printing system, that includes:
   (a) a printing bridge system, comprising a static and rigid printing bridge to accommodate in a precise manner several jet print heads, each being fitted with a multitude of jet nozzles, said jet print heads grouped in various arrangements on said static and rigid printing bridge, said jet print heads are utilized achieving multiple redundancy whereby part of the total amount of available nozzles are utilized as back-up nozzles; and
   (b) a platform system, comprising:
      (i) a printing table positioned substantially underneath said static and rigid printing bridge, for accommodating said platform whilst said pattern is dispensed in a jetting manner onto said platform; and
      (ii) a motorized system, for moving said printing table simultaneously in at least two perpendicular directions; and
(B) a supply system for supplying said several jet print heads with said liquid or viscous substance; and
(C) a control system responsive to at least pattern and platform data for controlling said platform system in order to achieve said dispensing of said liquid or viscous, jettable substance as said pattern onto said surface of said platform; and
(D) a user interface for at least providing a status report of said printing system.

2. The system in accordance with claim 1, wherein said printing bridge system is a horizontally static and rigid printing bridge and wherein said motorized system is a motorized planar system, for moving said printing table simultaneously in two perpendicular, planar directions.

3. The system in accordance with claim 2, wherein said horizontally static and rigid printing bridge is further capable of moving in a controlled fashion in a substantially vertical plane.

4. The system in accordance with claim 2, wherein said supply system comprises:
- (A) at least one storage unit, holding said liquid or viscous, jettable substance; and
- (B) tubing for carrying said liquid or viscous, jettable substance from said storage unit to said multitude of jet print heads; and
- (C) a pump system for moving said liquid or viscous, jettable substance from said storage unit to said multitude of jet print heads.

5. The system in accordance with claim 4, wherein said storage unit, holding said liquid or viscous, jettable substance comprises:
- (A) at least one main tank unit; and
- (B) a secondary tank unit for holding intermediately said liquid or viscous, jettable substance being transported from said main tank unit to said multitude of jet print heads.

6. The system in accordance with claim 4, wherein said supply system further comprises:
- (D) a pump system; and
- (E) a level detection control system, for detecting levels of said liquid or viscous, jettable substance at various locations, outputting electrical signals representative of said levels to said pump system; and
- (F) a multitude of level sensing devices, for maintaining desired said levels in said liquid or viscous, jettable substance supply system; and
- (G) a pressure regulation system for regulating pressure of said liquid or viscous, jettable substance to be in accordance with optimum jetting conditions; and
- (H) a multi-stage filter unit for removing various undesired material from said liquid or viscous, jettable substance prior to being dispensed in a jetting manner by said multitude of jet print heads onto said platform; and
- (I) a capping, purging, priming wiping and washing unit for conditioning said multitude of jet print heads; and
- (J) an air bubbles drainage system for removal of undesired air bubbles from said liquid or viscous, jettable substance; and
- (K) a temperature control system, comprising:
  - (a) a heating unit for adjusting the temperature of said liquid or viscous, jettable substance; and
  - (b) a temperature sensing unit, capable of sensing actual temperature of said liquid or viscous, jettable substance prior to being dispensed in a jetting manner by said multitude of jet print heads onto said platform; and conveying electrical data, representative of said actual temperature to said electronic system; and
  - (c) a temperature control unit, responsive to said temperature sensing unit and capable of altering temperature of said liquid or viscous, jettable substance to a desired and pre-determined temperature level and in addition, capable of maintaining said desired and pre-determined temperature level within desired and preferred close boundaries.

7. The system in accordance with claim 1, wherein said motorized system is a motorized planar system, for moving said printing table simultaneously in two perpendicular, planar horizontal directions and in addition, in a vertical direction.

8. The system in accordance with claim 1, wherein said printing system comprises a central console further including:
- (A) an electronic print support system, positioned substantially on said static and rigid printing bridge, comprising:
  - (a) an electronic multiple print head driver unit, constituting a multitude of power amplifiers, for amplifying electric signals to said multitude of jet print heads, said electronic multiple print head driver unit responsive to signals representative of image data from said control system and to be dispensed as said pattern onto said platform by said several jet print heads, said electronic multiple print head driver unit situated significantly close to said several jet print heads; and
- (B) a paired structure, constituting the two columns of said static and rigid printing bridge, securing said static and rigid printing bridge in a immovable manner, said paired structure positioned between the peripheral ends of said horizontally static and rigid printing bridge and uppermost exterior of said central console.

9. The system in accordance with claim 8, wherein said electronic print support system further includes:
- a motorized electronic printing bridge vertical motion system, positioned between said paired structure and said horizontally static and rigid printing bridge, comprising two motors for moving said horizontally static and rigid printing bridge in a vertical plane, substantially perpendicular to said surface of said platform, for achieving and maintaining desired jet operational distance between orifice plates of said multitude of jet print heads and said surface of said platform, said two motors positioned respectively between each of said two columns and said horizontally static and rigid printing bridge and responsive to operator's input of thickness of said platform.

10. The system in accordance with claim 8, wherein said supply system is positioned in two compartments, encompassing said central console, said central console and said two compartments jointly constituting the printer console.

11. The system in accordance with claim 10, wherein said printing system, said supply system, said control system and said user interface are retained entirely in said printer console for stand-alone applications.

12. The system in accordance with claim 11, wherein a multitude of additional said printer consoles are coupled to a single, shared said operator console in a centralized command mode.

13. The system in accordance with claim 12, wherein said supply system is a single, shared supply system, supplying said liquid or viscous, jettable substance to said multitude of printer consoles.

14. The system in accordance with claim 10, wherein said printer console and an operator console, comprising said control system and said user interface are two separate units, communicating with each other, for operating said jet dispensing print system from a remote location.

15. The system in accordance with claim 1, wherein said printing table further comprises a maintenance print area, in which a determined test print pattern is produced by said jet print heads; said determined test print pattern indicative of a multitude of print head malfunctions or respectively, the absence thereof.

16. The system in accordance with claim 1, wherein said printing table further comprises an area-addressable suction force valve system, comprising:
- (A) a vacuum pump system for providing suction force,
- (B) a manifold coupled to said vacuum pump for providing maximum suction force,
- (C) a reduction valve coupled to said vacuum pump, for reducing said maximum suction force to a predefined reduced level or, optionally, reducing suction force to substantially no suction force, (D) a manifold coupled to said reduction valve for providing said reduced or no suction force, (E) a multitude of manifold twin tubing, coupling said manifolds to a multitude of suction-valve-switching solenoids, (F) said multitude of suction-valve-switching solenoids, each comprising:
   (a) two entrances, each coupled via said manifold twin tubing to respectively said maximum suction force and said reduced (optionally, no suction force),
   (b) a cylinder responsive to a solenoid, for coupling either said maximum suction force or said reduced (optionally, said no suction force) to sole exit,
   (c) said solenoid responsive to system control electrical signals for inhibiting maximum suction force in suction areas underneath the print swath,
   (d) said sole exit, providing either said maximum suction force or said reduced suction force (optionally, said no suction force) in response to said system control electrical signals, (G) a multitude of tubing, coupling said sole exit of each said suction-valve-switching solenoids to the sole entrance of a multitude of suction-valve-bridging solenoids;

(H) said multitude of suction-valve-bridging solenoids, each comprising:
   (a) said sole entrance,
   (b) said sole entrance coupled to an exit,
   (c) a cylinder responsive to a solenoid, for coupling said sole entrance furthermore to second exit,
   (d) said solenoid responsive to system control electrical signals for limiting said maximum suction force or said reduced suction force (optionally, said no suction force) to suction force areas of said vacuum table where said platform exists, (I) a multitude of inlet twin tubing coupling said exit and said second exit to a multitude of respectively first and second valve inlets, constituents of a vacuum table, (J) said vacuum table for fixating said platform in an immovable manner and planarization of said platform whilst said pattern is being dispensed onto said surface of said platform, said vacuum table comprising:
   (a) a multitude of said addressable suction force areas,
   (b) said addressable suction force areas divided into a multitude of suction zones, substantially parallel to said print swath,
   (c) said suction zones divided into a multitude of suction sectors,
   (d) a multitude of suction holes, constituents of said suction sectors, and
   (e) said suction zones coupled respectively to said first and said second vacuum inlets by means of conduits.

17. The system in accordance with claim 16, wherein each said multitude of suction-valve-bridging solenoids further comprises:
(A) a cylinder responsive to a solenoid, coupled to said sole exit, and
(B) said solenoid responsive to system control electrical signals for inhibiting suction force in said respective suction zone not underneath said platform.

18. The system in accordance with claim 16, wherein said printing table further comprises:
(A) a print head capping system for inhibiting clogging of said industrial grade print heads during print dormancy; and
(B) a print head wiping system for removing excess of said liquid or viscous, jettable substance from said orifice plates of said industrial grade print heads; and
(C) a solvent washing system for cleaning said industrial grade print heads by means of washing said orifice plates with liquid or viscous, jettable substance soluble solution.

19. The system in accordance with claim 1, wherein a stand-alone supply system is utilized for supplying said jet print heads with said liquid or viscous jettable substance.

20. The system in accordance with claim 1, wherein said jet print heads are single color, monochrome jet print heads.

21. The system in accordance with claim 20, wherein said number of said nozzles is a multiple of the number required for printing at a desired resolution, representing a multiple redundancy, said monochrome jet print heads positioned and operated in such a manner that each nozzle is backed up by at least one other nozzle, achieved by substantially overlapping of said liquid or viscous, jettable substance dot pattern.

22. The system in accordance with claim 20, wherein said monochrome jet print heads are arranged on said horizontally static and rigid printing bridge in two parallel rows, each head in one row positioned in such fashion that said head covers the area not covered by the opposite head and an adjacent head in the other row, bringing about a queue of print heads, capable of dispensing said liquid or viscous, jettable substance in a continuous ribbon.

23. The system in accordance with claim 20, said monochrome jet print heads are arranged on said horizontally static and rigid printing bridge in a slanted arrangement.

24. The system in accordance with claim 23, wherein each said head performs as said back-up for an adjacent head, providing a multiple redundancy.

25. The system in accordance with claim 20, wherein at least one uneven row nozzle backs up its adjacent even row nozzle, or vice versa.

26. The system in accordance with claim 25, further comprising a timing system for modifying the firing timing of said single color, monochrome type of jet print heads to achieve said redundancy.

27. The system in accordance with claim 20, wherein said monochrome jet print heads are arranged on said horizontally static and rigid printing bridge in multiple, parallel rows, achieving abundance of nozzle numbers for multiple redundancy.

28. The system in accordance with claim 1, wherein said jet print heads are multi-color, single pass jet print heads.

29. The system in accordance with claim 28, wherein said multi-color, single pass jet print heads are 4-color, single pass jet print heads.

30. The system in accordance with claim 29, wherein said number of said nozzles is twice the number required for printing at a desired resolution, representing a redundancy of 100 percent, whilst said 4-color, single pass jet print heads are positioned and operated in such a manner that each nozzle is backed up by one other nozzle, utilizing same said liquid or viscous, jettable substance in all four color conduits of said 4-color, single pass jet print head.

31. The system in accordance with claim 30, wherein each said head in one row performs as said back-up for the corresponding head in the opposite row, providing a multiple redundancy.

32. The system in accordance with claim 28, wherein at least one uneven row nozzle backs up its adjacent even row nozzle, or vice versa.

33. The system in accordance with claim 32, further comprising a timing system for modifying the firing timing of said 4-color, single pass jet print head to achieve said redundancy.

34. The system in accordance with claim 1, wherein said platform is a printed circuit board (PCB).

35. The system in accordance with claim 1, wherein said platform is a backplane.

36. The system in accordance with claim 1, wherein said platform is a panel.

37. The system in accordance with claim 1, wherein said pattern is an etch resist mask and wherein said liquid or viscous, jettable substance is an etch resist masking liquid or viscous substance, capable of covering said platform in a pre-determined partial manner, to protect covered material against chemical agents.

38. The system in accordance with claim 37, wherein said chemical agent is an etchant, capable of removing uncovered material from said platform to produce a conducting pattern on said platform.

39. The system in accordance with claim 38, wherein said conducting pattern is an arbitrary pattern on said platform.

40. The system in accordance with claim 37, wherein said etch resist mask is a peelable, temporary etch resist mask.

41. The system in accordance with claim 37, wherein said etch resist masking liquid or viscous, jettable substance is:
    (A) melamine, or
    (B) epoxy, or
    (C) acrylate,
        curable by heat, UV exposure, or by a combination of several curing mechanisms,
        masking substance.

42. The system in accordance with claim 1, wherein said pattern is a solder resist mask and wherein said liquid or viscous, jettable substance is a solder resist masking liquid or viscous substance, capable of covering said platform in a pre-determined partial manner, to protect covered material against molten solder.

43. The system in accordance with claim 42, wherein said solder resist mask is a peelable, temporary solder resist mask, for utilizing said solder resist mask in a temporary manner.

44. The system in accordance with claim 42, wherein said solder resist masking liquid or viscous, jettable substance is:
    (A) melamine, or
    (B) epoxy, or
    (C) acrylate,
        curable by heat, UV exposure, or by a combination of several curing mechanisms,
        masking substance.

45. The system in accordance with claim 40, wherein said coating liquid or viscous, jettable substance is:
    (A) melamine, or
    (B) epoxy, or
    (C) acrylate,
        curable by heat, UV exposure, or by a combination of several curing mechanisms,
        coating substance.

46. The system in accordance with claim 1, wherein said pattern is a conformal coating and wherein said liquid or viscous, jettable substance is a coating liquid or viscous, jettable substance for coating said platform in a selective, predetermined partial or complete manner.

47. The system in accordance with claim 1, wherein said pattern is a plating resist mask and said liquid or viscous, jettable substance is a plating control liquid or viscous substance, capable of covering said platform in a pre-determined partial manner to govern a plating step.

48. The system in accordance with claim 47, further comprising a vision unit capable of detecting plating uniformity.

49. The system in accordance with claim 47, wherein said plating resist mask is a peelable, temporary plating resist mask, for utilizing said plating resist mask in a temporary manner.

50. The system in accordance with claim 1, wherein said pattern is a legend and wherein said liquid or viscous, jettable substance is legend ink for dispensing onto said platform.

51. The system in accordance with claim 50, wherein said pattern constitutes a variable information content part.

52. The system in accordance with claim 50, wherein said legend ink is:
    (A) melamine, or
    (B) epoxy, or
    (C) acrylate,
        curable by heat, UV exposure, or by a combination of several curing mechanisms,
        jettable ink.

53. The system in accordance with claim 1, wherein said pattern is an edging non-uniformity compensation control pattern and wherein said liquid or viscous, jettable substance is an edging non-uniformity compensation control masking substance for controlling edge formation of conducting pattern on said platform whilst said platform is being submitted to said etchant agents.

54. The system in accordance with claim 53, further comprising a vision unit capable of sampling width of said edge.

55. The system in accordance with claim 1, wherein said pattern is an adhesive pattern and wherein said liquid or viscous, jettable substance is an adhesive for providing temporary fixation of components prior to soldering in SMT procedures.

56. The system in accordance with claim 1, further comprising a dusting unit, and wherein said pattern is a resistor component pattern and wherein said liquid or viscous, jettable substance has carbon concentration dependant electrical conductive properties by virtue of carbon particles inherent part of said jettable substance.

57. The system in accordance with claim 1, further comprising a dusting unit, and wherein said pattern is a capacitor component pattern and wherein said liquid or viscous, jettable substance has carbon concentration dependant electrical conductive properties by virtue of carbon particles inherent part of said jettable substance.

58. The system in accordance with claim 1 further comprising a dusting unit, and wherein said pattern is a solder paste pattern and wherein said liquid or viscous, jettable substance is a solder paste substance.

59. The system in accordance with claim 1, wherein said control system is implemented in a computer comprising:
    (A) a keyboard for providing means for operator input; and
    (B) multiple peripheral input devices, for providing means for inputting data; and
    (C) a memory; and
    (D) one or more hard disk drives; and
    (E) a display device, for providing:
        (a) visual operator interactivity with various systems, devices and units of said printing system; and
        (b) visual graphical representation of data input from said multiple peripheral input devices, said data representative of said pattern to be printed onto said platform; and
        (c) inspection of said pattern and enabling amendments to said pattern prior to printing; and
    (F) an interface system for interfacing said operator console with various components of said printing system, comprising cabling and various interface cards; and (G) a power supply unit for supplying electric current to:
  (a) said electronic motorized planar motion control system; and
  (b) said electronic multiple print head driver unit; and
  (c) said motorized electronic printing bridge vertical motion system; and
(H) a maintenance control unit, controlling:
  (a) said print head capping system;
  (b) said print head wiping system;
  (c) said solvent washing system; and
(I) a data input interface system, for inputting said data input from said multiple peripheral input devices, said data in a supported file format; and
(J) an image processing system, for transforming said data in a supported file format into raster data; and
(K) a dividing system for dividing said raster data into smaller data files, said smaller data files representative of adjacent strips of said variable pattern, said adjacent strips representing the components of said pattern that said print head is capable of printing in one direction of said motorized planar system; and
(L) a print buffer for storing temporarily said raster data, said raster data inputted into said electronic multiple print head driver unit in a sequential manner constituting the data of one print line to be printed during one pass of said print head; and
(F) a relative velocity compensation algorithms processor for:
  (a) compensating for undesirable effects deriving from relative velocity between said platform and said jet print heads; and
  (b) optimizing said data input for achieving optimum results when said pattern is dispensed onto said surface of said platform in said jetting manner.

60. The system in accordance with claim 59, wherein said supported file format is the Gerber file format.

61. The system in accordance with claim 59, wherein said supported file format is the extended Gerber file format.

62. The system in accordance with claim 59, wherein said supported file format is a known image file format.

63. The system in accordance with claim 59, wherein said multiple peripheral input devices comprises:
  (A) a diskette drive;
  (B) a digital data cartridge drive unit for accepting digital data cassettes containing digital files representative of patterns to be transferred onto said PCB;
  (C) a network interface unit for receiving and transmitting data to and from a network.

64. The system in accordance with claim 63, wherein said network is an Intranet.

65. The system in accordance with claim 63, wherein said network is an Internet.

66. The system in accordance with claim 59, further comprising a curing system utilizing an UV exposure unit for initial or complete curing or tack-free drying of UV curable, jettable substance after being dispensed by said jet dispensing print system.

67. The system in accordance with claim 66, wherein said curing system is an IR thermal oven for initial or complete curing of tack-free drying of heat curable, jettable substance after being dispensed by said jet dispensing print system.

68. The system in accordance with claim 1, wherein said control system further comprising:
  (A) a computer, comprising:
    (a) a keyboard for providing means for operator input; and
    (b) multiple peripheral input devices, for providing means for inputting data; and
    (c) a memory; and
    (d) one or more hard disk drives; and
    (e) a display device, for providing:
      (i) visual operator interactivity with various systems, devices and units of said printing system; and
      (ii) visual graphical representation of data input form said multiple peripheral input devices, said data representative of said pattern to be printed onto said platform; and
      (iii) inspection of said pattern and enabling amendments to said pattern prior to printing; and
    (f) an interface system for interfacing said operator console with various components of said printing system, comprising cabling and various interface cards; and
    (g) a power supply unit for supplying electric current to:
      (i) said electronic motorized planar motion control system; and
      (ii) said electronic multiple print head driver unit; and
      (iii) said motorized electronic printing bridge vertical motion system; and
    (h) a maintenance control unit, controlling:
      (i) said print head capping system;
      (ii) said print head wiping system;
      (iii) said solvent washing system; and
    (i) a data input interface system, for inputting said data input from said multiple peripheral input devices, said data in a supported file format;
    (j) a relative velocity compensation algorithms processor for:
      (i) compensating for undesirable effects deriving from relative velocity between said platform and said jet print heads;
      (ii) optimizing said data input for achieving optimum results when said pattern is dispensed onto said surface of said platform in said jetting manner; and
  (B) a vision system responsive to:
    (a) platform dimensional features, enabling alignment of said pattern dispensed onto said platform; and
    (b) distortions of said platform; enabling applying skewing procedures, thus adapting said pattern to be conform said distorted platform; and
    (c) identifying positional data of one or more fiducial marks and/or pads for obtaining precise positioning reference data to be utilized for said skewing and alignment of said pattern to be dispensed onto said platform.

69. The system in accordance with claim 68, wherein said vision system determines said platform dimensional features, enabling alignment of said pattern dispensed onto said platform for less critical pattern dispensing procedures.

70. The system in accordance with claim 68, wherein said vision system further is responsive to said test print pattern, printed in said maintenance print area, part of said printing table, for generating electrical control signals, indicative of said jet print heads performance.

71. A jet dispensing print method for dispensing a liquid or viscous, jettable substance as a pattern onto the surface of a platform in an industrial manufacturing production line, comprising the steps of utilizing:
  (A) a printing system, including:
    (a) a printing bridge system, comprising a static and rigid printing bridge to accommodate in a precise manner several jet print heads, each being fitted with a multitude of jet nozzles, said jet print heads grouped in various arrangements on said static and rigid printing bridge, said jet print heads are utilized achieving multiple redundancy whereby part of the total amount of available nozzles are utilized as back-up nozzles; and (b) a platform system, comprising:
   (i) a printing table positioned substantially underneath said static and rigid printing bridge, for accommodating said platform whilst said pattern is dispensed in a jetting manner onto said platform,
   (ii) an area-addressable suction force vacuum table; and
   (iii) a motorized system, for moving said printing table simultaneously in at least two perpendicular directions; and (B) a supply system for supplying said several jet print heads with said liquid or viscous substance; and (C) a control system responsive to at least pattern and platform data and controlling said platform system for achieving said dispensing of said liquid or viscous, jettable substance as said pattern onto said surface-of said platform; and (D) a user interface for at least providing a status report of said printing system.

72. The method in accordance with claim 71, further comprising the step of utilizing a horizontally static and rigid printing bridge and wherein said motorized system is a motorized planar system, for moving said printing table simultaneously in two perpendicular, planar directions.

73. The method in accordance with claim 72, further comprising the steps of utilizing:

(A) an electronic print support system;

(B) an electronic multiple print head driver unit, constituting a multitude of power amplifiers, for amplifying electric signals to said multitude of jet print heads, said electronic multiple print head driver unit responsive to signals representative of image data from said control system and to be dispensed as said pattern onto said platform by said several jet print heads, said electronic multiple print head driver unit situated significantly close to said several jet print heads; and (C) a paired structure, constituting the two columns of said static and rigid printing bridge, securing said static and rigid printing bridge in a immovable manner, said paired structure positioned between the peripheral ends of said horizontally static and rigid printing bridge and uppermost exterior of said central console.

74. The method in accordance with claim 73, further comprising the step of utilizing a motorized electronic printing bridge vertical motion system, for achieving and maintaining desired jet operational distance between orifice plates of said multitude of jet print heads and said surface of said platform, and responsive to operator's input of thickness of said platform.

75. The method in accordance with claim 71, further comprising the steps of utilizing a computer, part of said control system, utilizing:

(A) a keyboard for providing means for operator input; and (B) multiple peripheral input devices, for providing means for inputting data; and (C) a memory; and (D) one or more hard disk drives; and (E) a display device, for providing:
   (a) visual operator interactivity with various systems, devices and units of said printing system; and
   (b) visual graphical representation of data input from said multiple peripheral input devices, said data representative of said pattern to be printed onto said platform; and
   (c) inspection of said pattern and enabling amendments to said pattern prior to printing; and (F) an interface system for interfacing said operator console with various components of said printing system, comprising cabling and various interface cards; and (G) a power supply unit for supplying electric current to:
   (a) said electronic motorized planar motion control system; and
   (b) said electronic multiple print head driver unit; and
   (c) said motorized electronic printing bridge vertical motion system; and (H) an area-addressable suction force valve system, controlling:
   (a) multitude of suction-valve-switching solenoids; and
   (b) a multitude of suction-valve-bridging solenoids; for limiting said maximum suction force or said reduced suction force (optionally, said no suction force) to said suction force areas of said vacuum table where said platform exists and for inhibiting said maximum suction force in said suction areas underneath said print swath; and (I) a maintenance control unit, controlling:
   (a) said print head capping system;
   (b) said print head wiping system;
   (c) said solvent washing system; and (J) a data input interface system, for inputting said data input from said multiple peripheral input devices, said data in a supported file format; and (K) an image processing system, for transforming said data in a supported file format into raster data; and (L) a dividing system for dividing said raster data into smaller data files, said smaller data files representative of adjacent strips of said variable pattern, said adjacent strips representing the components of said pattern that said print head is capable of printing in one direction of said motorized planar system; and (M) a print buffer for storing temporarily said raster data, said raster data inputted into said electronic multiple print head driver unit in a sequential manner constituting the data of one print line to be printed during one pass of said print head; and (N) a relative velocity compensation algorithms processor for:
   (a) compensating for undesirable effects deriving from relative velocity between said platform and said jet print heads; and
   (b) optimizing said data input for achieving optimum results when said pattern is dispensed onto said surface of said platform in said jetting manner; and (O) a vision system responsive to:
   (a) platform dimensional features, enabling alignment of said pattern dispensed onto said platform; and
   (b) distortions of said platform; enabling applying skewing procedures, thus adapting said pattern to be conform said distorted platform; and
   (c) identifying positional data of one or more fiducial marks and/or pads for obtaining precise positioning reference data to be utilized for said skewing and alignment of said pattern to be dispensed onto said platform.

* * * * *